(12) United States Patent
Kimoto

(10) Patent No.: US 12,219,788 B2
(45) Date of Patent: Feb. 4, 2025

(54) LIGHT-EMITTING ELEMENT AND LIGHT-EMITTING DEVICE

(71) Applicant: SHARP KABUSHIKI KAISHA, Osaka (JP)

(72) Inventor: Kenji Kimoto, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 449 days.

(21) Appl. No.: 17/634,390

(22) PCT Filed: Aug. 13, 2019

(86) PCT No.: PCT/JP2019/031807
§ 371 (c)(1),
(2) Date: Feb. 10, 2022

(87) PCT Pub. No.: WO2021/029007
PCT Pub. Date: Feb. 18, 2021

(65) Prior Publication Data
US 2022/0328785 A1   Oct. 13, 2022

(51) Int. Cl.
| | | |
|---|---|---|
| H01L 51/50 | (2006.01) | |
| H10K 50/11 | (2023.01) | |
| H10K 50/15 | (2023.01) | |
| H10K 50/16 | (2023.01) | |
| H10K 101/40 | (2023.01) | |
| H10K 102/00 | (2023.01) | |

(52) U.S. Cl.
CPC ........... *H10K 50/156* (2023.02); *H10K 50/11* (2023.02); *H10K 50/166* (2023.02); *H10K 2101/40* (2023.02); *H10K 2102/00* (2023.02)

(58) Field of Classification Search
CPC .... H10K 50/156; H10K 50/11; H10K 50/166; H10K 2101/40; H10K 2102/00; H10K 59/35
USPC ........................................................... 257/43
See application file for complete search history.

(56) References Cited

U.S. PATENT DOCUMENTS

2010/0108984 A1   5/2010   Cho et al.
2015/0042933 A1*  2/2015   Ueki ................... G02B 5/0242
                                                        359/599

FOREIGN PATENT DOCUMENTS

| EP | 1806791 A2 * | 7/2007 | ........... C09K 11/565 |
| JP | 2010-114079 A | 5/2010 | |
| WO | WO-2013027735 A1 * | 2/2013 | ......... H01L 51/5088 |

* cited by examiner

Primary Examiner — Tong-Ho Kim
(74) Attorney, Agent, or Firm — ScienBiziP, P.C.

(57) ABSTRACT

A light-emitting element includes: a first electrode serving as an anode; a second electrode serving as a cathode; a light-emitting layer, of a first wavelength range, provided between the first electrode and the second electrode; an oxide layer provided between the light-emitting layer of the first wavelength range and the first electrode of the first electrode and the second electrode; and an oxide layer provided between the oxide layer and the second electrode, and having contact with the oxide layer. Either the oxide layer or the oxide layer whichever farther away from the light-emitting layer of the first wavelength range is made of a semiconductor. A density of oxygen atoms in the oxide layer is lower than a density of oxygen atoms in the oxide layer.

19 Claims, 14 Drawing Sheets

|  | DENSITY (g/cm³) | FORMULA WEIGHT (g/mol) | DENSITY OF OXYGEN ATOM (mol/cm³) |
|---|---|---|---|
| NiO | 6.67 | 74.69 | 0.0893 |
| CuAlO₂ | 5.08 | 122.525 | 0.0830 |
| Cu₂O | 6.04 | 143.09 | 0.0422 |

(b)

|  | DENSITY (g/cm³) | FORMULA WEIGHT (g/mol) | DENSITY OF OXYGEN ATOM (mol/cm³) |
|---|---|---|---|
| Al₂O₃ | 3.95 | 102.0 | 0.1162 |
| Ga₂O₃ (α) | 6.44 | 187.4 | 0.1031 |
| Ga₂O₃ (β) | 5.88 | 187.4 | 0.0941 |
| Ta₂O₅ | 8.20 | 441.9 | 0.0928 |
| ZrO₂ | 5.68 | 123.2 | 0.0922 |
| HfO₂ | 9.68 | 210.5 | 0.0920 |
| MgO | 3.65 | 40.3 | 0.0906 |
| GeO₂ | 4.23 | 104.6 | 0.0808 |
| SiO₂ | 2.20 | 60.1 | 0.0732 |
| Y₂O₃ | 5.01 | 225.8 | 0.0666 |
| La₂O₃ | 6.51 | 325.8 | 0.0599 |
| SrO | 4.70 | 103.6 | 0.0454 |

FIG.6

| OXIDE LAYER (HTL) 124a | OXIDE LAYER 124b |
|---|---|
| NiO<br>CuAlO₂ | SrO<br>La₂O₃<br>Y₂O₃<br>SiO₂<br>GeO₂<br>COMPLEX OXIDE CONTAINING TWO OR MORE KINDS OF CATIONS OF SrO, La₂O₃, Y₂O₃, SiO₂, AND GeO₂ |

|  | DENSITY (g/cm³) | FORMULA WEIGHT (g/mol) | DENSITY OF OXYGEN ATOM (mol/cm³) |
|---|---|---|---|
| $TiO_2$ (RUTILE) | 4.26 | 79.9 | 0.1067 |
| $TiO_2$ (ANATASE) | 3.90 | 79.9 | 0.0977 |
| $SnO_2$ | 6.95 | 150.7 | 0.0922 |
| $SrTiO_3$ | 5.13 | 183.5 | 0.0839 |
| $In_2O_3$ | 7.18 | 277.6 | 0.0776 |
| ZnO | 5.61 | 81.4 | 0.0689 |

(b)

|  | DENSITY (g/cm³) | FORMULA WEIGHT (g/mol) | DENSITY OF OXYGEN ATOM (mol/cm³) |
|---|---|---|---|
| $Al_2O_3$ | 3.95 | 102.0 | 0.1162 |
| $Ga_2O_3(\alpha)$ | 6.44 | 187.4 | 0.1031 |
| $Ga_2O_3(\beta)$ | 5.88 | 187.4 | 0.0941 |
| $Ta_2O_5$ | 8.20 | 441.9 | 0.0928 |
| $ZrO_2$ | 5.68 | 123.2 | 0.0922 |
| $HfO_2$ | 9.68 | 210.5 | 0.0920 |
| MgO | 3.65 | 40.3 | 0.0906 |
| $GeO_2$ | 4.23 | 104.6 | 0.0808 |
| $SiO_2$ | 2.20 | 60.1 | 0.0732 |
| $Y_2O_3$ | 5.01 | 225.8 | 0.0666 |
| $La_2O_3$ | 6.51 | 325.8 | 0.0599 |
| SrO | 4.70 | 103.6 | 0.0454 |

FIG.14

| OXIDE LAYER (ETL) 74a | OXIDE LAYER 74b |
|---|---|
| ZnO | $Al_2O_3$<br>$Ga_2O_3$<br>$Ta_2O_5$<br>$ZrO_2$<br>$HfO_2$<br>MgO<br>$GeO_2$<br>$SiO_2$<br>COMPLEX OXIDE CONTAINING TWO OR MORE KINDS OF CATIONS OF $Al_2O_3$, $Ga_2O_3$, $Ta_2O_5$, $ZrO_2$, $HfO_2$, MgO, $GeO_2$, AND $SiO_2$ |
| $TiO_2$ | $Al_2O_3$<br>$Ga_2O_3$<br>COMPLEX OXIDE CONTAINING TWO OR MORE KINDS OF CATIONS OF $Al_2O_3$ AND $Ga_2O_3$ |
| $In_2O_3$ | $Al_2O_3$<br>$Ga_2O_3$<br>$Ta_2O_5$<br>$ZrO_2$<br>$HfO_2$<br>MgO<br>$GeO_2$<br>COMPLEX OXIDE CONTAINING TWO OR MORE KINDS OF CATIONS OF $Al_2O_3$, $Ga_2O_3$, $Ta_2O_5$, $ZrO_2$, $HfO_2$, MgO, AND $GeO_2$ |
| $SnO_2$ | $Al_2O_3$<br>$Ga_2O_3$<br>$Ta_2O_5$<br>COMPLEX OXIDE CONTAINING TWO OR MORE KINDS OF CATIONS OF $Al_2O_3$, $Ga_2O_3$, AND $Ta_2O_5$ |
| $SrTiO_3$ | $Al_2O_3$<br>$Ga_2O_3$<br>$Ta_2O_5$<br>$ZrO_2$<br>$HfO_2$<br>COMPLEX OXIDE CONTAINING TWO OR MORE KINDS OF CATIONS OF $Al_2O_3$, $Ga_2O_3$, $Ta_2O_5$, $ZrO_2$, AND $HfO_2$ |

LIGHT-EMITTING ELEMENT AND LIGHT-EMITTING DEVICE

TECHNICAL FIELD

The present disclosure relates to a light-emitting element and a light-emitting device, such as a display device and a lighting device, including the light-emitting element.

BACKGROUND ART

In recent years, various kinds of display devices are being developed. In particular, display devices including organic light-emitting diodes (OLEDs) and display devices including inorganic light-emitting diodes or quantum-dot light-emitting diodes (QLEDs) are attracting considerable attention because such display devices are low in power consumption, thin in profile, and high in image quality.

However, a problem of the light-emitting elements including OLEDs and QLEDs is that their light emission efficiency is likely to deteriorate, since it is hard in such light-emitting elements to see at least one of the following injections, that is, efficient injection of holes in a light-emitting layer or efficient injection of electrons in the light-emitting layer, because of the reasons below.

FIG. 19 is an energy band diagram showing a reason why it is hard to see injection of holes and electrons in a known light-emitting element 201 such as an OLED and a QLED.

As illustrated in FIG. 19, the light-emitting element 201 includes: a first electrode (a hole injection layer: an anode); and a second electrode (an electron injection layer: a cathode). Between the first electrode and the second electrode, a hole-transport layer 202, a light-emitting layer 203, and an electron-transport layer 204 are stacked in the stated order from toward the first electrode.

In the light-emitting element 201, a height of a hole injection barrier Eh from the hole-transport layer 202 to the light-emitting layer 203 corresponds to an energy difference between an upper end of a valence band of the hole-transport layer 202 (an HTL valence band) and an upper end of a valence band of the light-emitting layer 203.

Moreover, in the light-emitting element 201, a height of an electron injection barrier Ee from the electron-transport layer 204 to the light-emitting layer 203 corresponds to an energy difference between a lower end of a conduction band of the light-emitting layer 203 and a lower end of a conduction band of the electron-transport layer 204 (an ETL conduction band).

However, as to light-emitting materials of OLEDs or QLEDs contained in the light-emitting layer 203, and materials of the hole-transport layer 202 and the electron-transport layer 204, there are few such materials ensuring long time reliability. As a matter of fact, options for the materials are limited.

When materials are selected for the hole-transport layer 202, the light-emitting layer 203, and the electron-transport layer 204 from among the few materials, at least one of the hole injection barrier Eh or the electron injection barrier Ee is typically high. Hence, it is difficult to efficiently carry out at least one of (i) injection of holes from the hole-transport layer 202 into the light-emitting layer 203, and (ii) injection of electrons from the electron-transport layer 204 into the light-emitting layer 203.

Patent Document 1 describes a light-emitting layer formed to have faces each in contact with one of the hole-transport layer and the electron-transport layer. Each face has a different organic ligand distribution, making it possible to adjust a band level of the light-emitting layer. Specifically, Patent Document 1 describes that the band level of the light-emitting layer is adjusted to narrow energy difference between valence band levels of the hole-transport layer and the light-emitting layer. Hence, Patent Document 1 describes that a light-emitting element including the light-emitting layer can operate on a low turn-ON voltage and a low drive voltage, and excel in luminance and light emission efficiency.

CITATION LIST

Patent Literature

[Patent Document 1] Japanese Unexamined Patent Application Publication No. 2010-114079 (Published on May 20, 2010)

SUMMARY

Technical Problem

In Patent Document 1, however, a difference in ionization potential is small between a light-emitting layer whose band level is not adjusted and a light-emitting layer whose band level is adjusted. Hence, the hole injection barrier Eh cannot be lowered to a satisfactory height. Likewise, even if the band level adjustment described in Patent Document 1 is carried out, the electron injection barrier Ee cannot be lowered to a satisfactory height. Hence, Patent Document 1 still has difficulty in efficient injection of holes and electrons, and thus has a problem of poor light emission efficiency.

In view of the above problems, an aspect of disclosure is intended to provide a light-emitting element and a light-emitting device achieving high light emission efficiency.

Solution to Problems

In order to solve the above problems, an aspect of a light-emitting element according to disclosure includes:
  a first electrode serving as an anode;
  a second electrode serving as a cathode;
  a light-emitting layer provided between the first electrode and the second electrode;
  a first oxide layer provided between the light-emitting layer and either the first electrode or the second electrode; and
  a second oxide layer provided between the first oxide layer and the second electrode, and having contact with the first oxide layer.
Either the first oxide layer or the second oxide layer whichever farther away from the light-emitting layer is made of a semiconductor.
A density of oxygen atoms in the second oxide layer is lower than a density of oxygen atoms in the first oxide layer.

In order to solve the above problems, an aspect of a light-emitting element according to disclosure includes:
  a first electrode serving as an anode;
  a second electrode serving as a cathode;
  a light-emitting layer provided between the first electrode and the second electrode;
  a first oxide layer provided between the first electrode and the light-emitting layer; and
  a second oxide layer provided between the first oxide layer and the light-emitting layer, and having contact with the first oxide layer.

The first oxide layer contains at least one of nickel oxide or copper-aluminum oxide.

The second oxide layer contains at least one of strontium oxide, lanthanum oxide, yttrium oxide, silicon oxide, germanium oxide, or a complex oxide containing two or more kinds of cations of the strontium oxide, the lanthanum oxide, the yttrium oxide, the silicon oxide, and the germanium oxide.

In order to solve the above problems, an aspect of a light-emitting element according to disclosure includes:
- a first electrode serving as an anode;
- a second electrode serving as a cathode;
- a light-emitting layer provided between the first electrode and the second electrode;
- a first oxide layer provided between the second electrode and the light-emitting layer; and
- a second oxide layer provided between the first oxide layer and the second electrode, and having contact with the first oxide layer.

An oxide containing at least one of aluminum oxide, gallium oxide, or a complex oxide containing two or more kinds of cations of the aluminum oxide and the gallium oxide is of a first group.

An oxide containing at least one of aluminum oxide, gallium oxide, tantalum oxide, or a complex oxide containing two or more kinds of cations of the aluminum oxide, the gallium oxide, and the tantalum oxide is of a second group.

An oxide containing at least one of aluminum oxide, gallium oxide, tantalum oxide, zirconium oxide, hafnium oxide, or a complex oxide containing two or more kinds of cations of the aluminum oxide, the gallium oxide, the tantalum oxide, the zirconium oxide, and the hafnium oxide is of a third group.

An oxide containing at least one of aluminum oxide, gallium oxide, tantalum oxide, zirconium oxide, hafnium oxide, magnesium oxide, germanium oxide, or a complex oxide containing two or more kinds of cations of the aluminum oxide, the gallium oxide, the tantalum oxide, the zirconium oxide, the hafnium oxide, the magnesium oxide, and the germanium oxide is of a fourth group.

An oxide containing at least one of aluminum oxide, gallium oxide, tantalum oxide, zirconium oxide, hafnium oxide, magnesium oxide, germanium oxide, silicon oxide, or a complex oxide containing two or more kinds of cations of the aluminum oxide, the gallium oxide, the tantalum oxide, the zirconium oxide, the hafnium oxide, the magnesium oxide, the germanium oxide, and the silicon oxide is of a fifth group.

If the second oxide layer contains titanium oxide, the first oxide layer is the oxide of the first group.

If the second oxide layer contains tin oxide, the first oxide layer is the oxide of the second group.

If the second oxide layer contains strontium titanate, the first oxide layer is the oxide of the third group.

If the second oxide layer contains indium oxide, the first oxide layer is the oxide of the fourth group.

If the second oxide layer contains zinc oxide, the first oxide layer is the oxide of the fifth group.

In order to solve the above problems, an aspect of a light-emitting device according to disclosure includes the light-emitting element.

Advantageous Effect of Invention

An aspect of disclosure can provide a light-emitting element and a light-emitting device achieving high light emission efficiency.

BRIEF DESCRIPTION OF DRAWINGS

FIG. 3($b$) is an energy band diagram illustrating a hole injection barrier of the light-emitting element according to the first embodiment.

FIG. 4($b$) illustrates electric dipoles formed, with the motion of the oxygen atoms, on the interface between the oxide layers illustrated in FIG. 3($b$).

FIG. 5($a$) is a table showing examples of inorganic oxides included in a common hole-transport layer, and densities of the oxygen atoms in the inorganic oxides. FIG. 5($b$) is a table showing examples of typical inorganic oxides and densities of the oxygen atoms in the typical inorganic oxides.

FIG. 6 is a table showing materials to be selected for an oxide layer (an HTL) from among the examples of the inorganic oxides included in the common hole-transport layer illustrated in FIG. 5($a$), and materials to be selected, for an oxide layer between the oxide layer (the HTL) and a light-emitting layer of a first wavelength range, from among the examples of the typical inorganic oxides listed in FIG. 5($b$).

FIG. 7($b$) illustrates a schematic configuration of another light-emitting element according to the second embodiment.

FIG. 10($b$) illustrates a schematic configuration of another light-emitting element according to the fifth embodiment.

FIG. 11($b$) is an energy band diagram illustrating an electron injection barrier of the light-emitting elements according to the fifth embodiment.

FIG. 12($b$) illustrates electric dipoles formed, with the motion of the oxygen atoms, on the interface between the oxide layers illustrated in FIG. 11($b$).

FIG. 13($a$) is a table showing examples of inorganic oxides included in a common electron-transport layer, and densities of the oxygen atoms in the inorganic oxides. FIG. 13($b$) is a table showing examples of typical inorganic oxides and densities of the oxygen atoms in the typical inorganic oxides.

FIG. 14 is a table showing materials to be selected for an oxide layer (an HTL) from among the examples of the inorganic oxides included in the common electron-transport layer illustrated in FIG. 13($a$), and materials to be selected, for an oxide layer between the oxide layer (the HTL) and a light-emitting layer of a first wavelength range, from among the examples of the typical inorganic oxides listed in FIG. 13($b$).

DESCRIPTION OF EMBODIMENTS

Embodiments of the present disclosure will be described below, with reference to FIGS. 1 to 18. Hereinafter, the same reference signs are used to denote components having the same functions as functions of components described in a specific embodiment. Description of such components may be omitted.

In the embodiments of the present disclosure below, an example of a light-emitting device provided with a light-emitting element on a substrate includes, but not limited to, a display device provided with a plurality of light-emitting elements on a substrate. Alternatively, the example may include a lighting device provided with one or more light-emitting elements on a substrate.

First Embodiment

Figure 2:
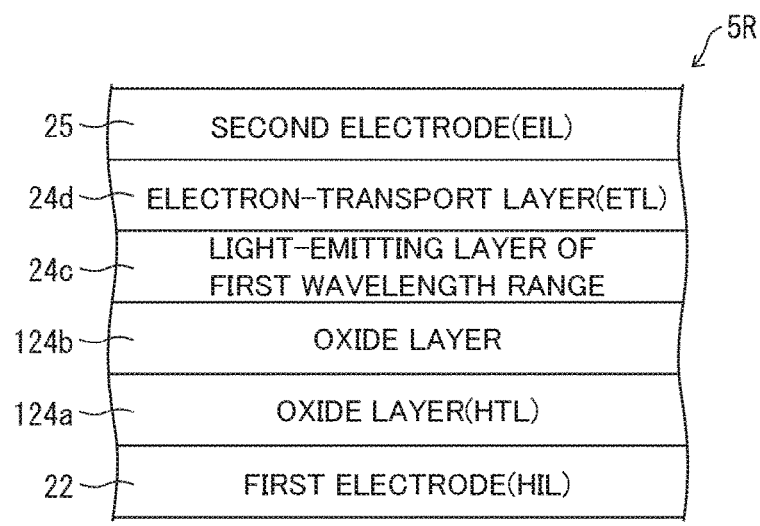
FIG. 2 illustrates a schematic configuration of the light-emitting element according to the first embodiment.
Figure 3:
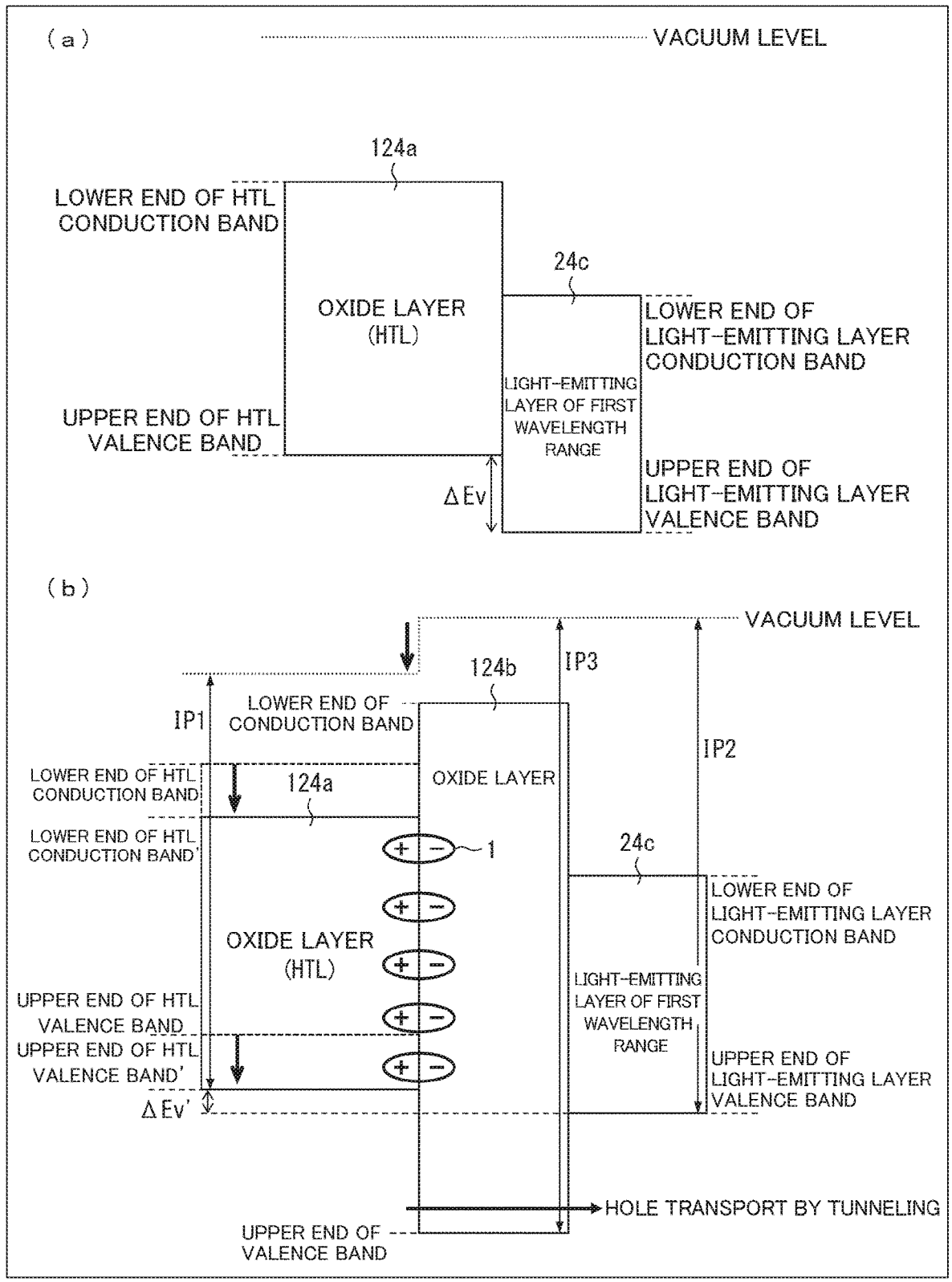
FIG. 3($a$) is an energy band diagram illustrating a hole injection barrier of a light-emitting element according to a comparative example.
Figure 4:
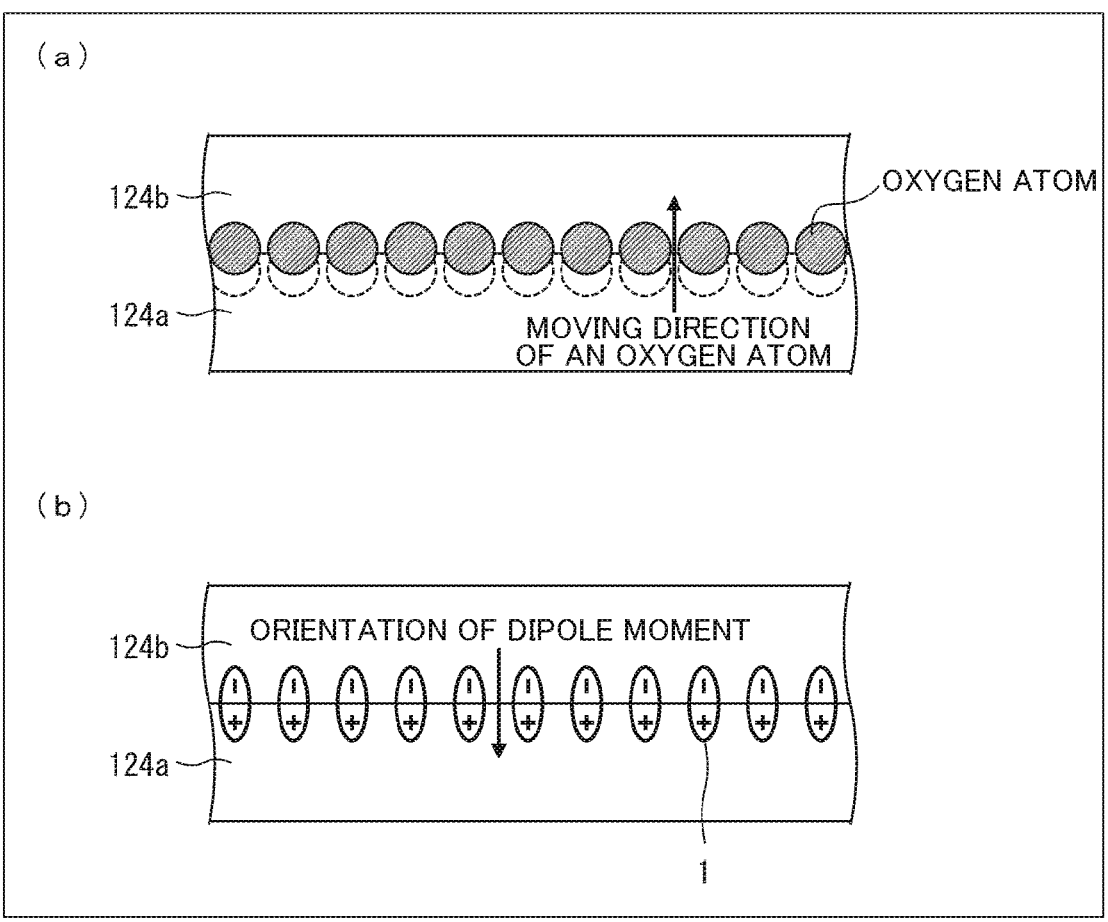
FIG. 4($a$) illustrates a mechanism of how oxygen atoms move across an interface between oxide layers illustrated in FIG. 3($b$).

FIG. 2 illustrates a schematic configuration of a light-emitting element 5R according to a first embodiment.

As illustrated in FIG. 2, the light-emitting element 5R includes: a first electrode (a hole-injection layer: an HIL) 22; a second electrode (an electron-injection layer: an EIL) 25; and a light-emitting layer 24c of a first wavelength range provided between the first electrode 22 and the second electrode 25. That is, the first electrode 22 is an anode, and the second electrode 25 is a cathode. Between the first electrode 22 and the light-emitting layer 24c of the first wavelength range, an oxide layer (a hole-transport layer (an HTL), namely, a first oxide layer) 124a and an oxide layer (a second oxide layer) 124b are stacked on top of another in the stated order from toward the first electrode 22. As will described later, a density of oxygen atoms in the oxide layer 124b is lower than a density of oxygen atoms in the oxide layer 124a. Between the light-emitting layer 24c of the first wavelength range and the second electrode 25, an electron-transport layer (an ETL) 24d is provided.

FIG. 4(a) illustrates a mechanism of how oxygen atoms move across an interface between the oxide layer 124a and the oxide layer 124b. FIG. 4(b) illustrates electric dipoles 1 formed, with the motion of the oxygen atoms, on the interface between the oxide layer 124a and the oxide layer 124b.

As illustrated in FIG. 4(a), the density of the oxide atoms in the oxide layer 124b is lower than the density of the oxide atoms in the oxide layer 124a. Hence, when the oxide layer 124a and the oxide layer 124b are formed in contact with each other, the oxygen atoms are likely to move from the oxide layer 124a toward the oxide layer 124b across the interface between the oxide layer 124a and the oxide layer 124b. When the oxygen atoms move, the oxygen vacancies are charged positively and the moved oxygen atoms are charged negatively.

Hence, as illustrated in FIG. 4(b), across the interface between the oxide layer 124a and the oxide layer 124b, the electric dipoles 1 are generated to include a dipole moment oriented from the oxide layer 124b toward the oxide layer 124a.

Note that the oxide layer 124a is preferably made of an inorganic oxide, such that long-time reliability of the light-emitting element improves. That is, the light emission efficiency of the light-emitting element after aging improves. Moreover, the oxide layer 124b is preferably made of an inorganic oxide, such that long-time reliability of the light-emitting element improves. That is, the light emission efficiency of the light-emitting element after aging improves. Furthermore, the oxide layer 124b is preferably an insulator. That is, either the first oxide layer (the oxide layer 124a) or the second oxide layer (the oxide layer 124b) whichever closer to the light-emitting layer (the light-emitting layer 24c of the first wavelength range) is preferably made of an insulator. Hence, long-time reliability of the light-emitting element improves.

Figure 1:
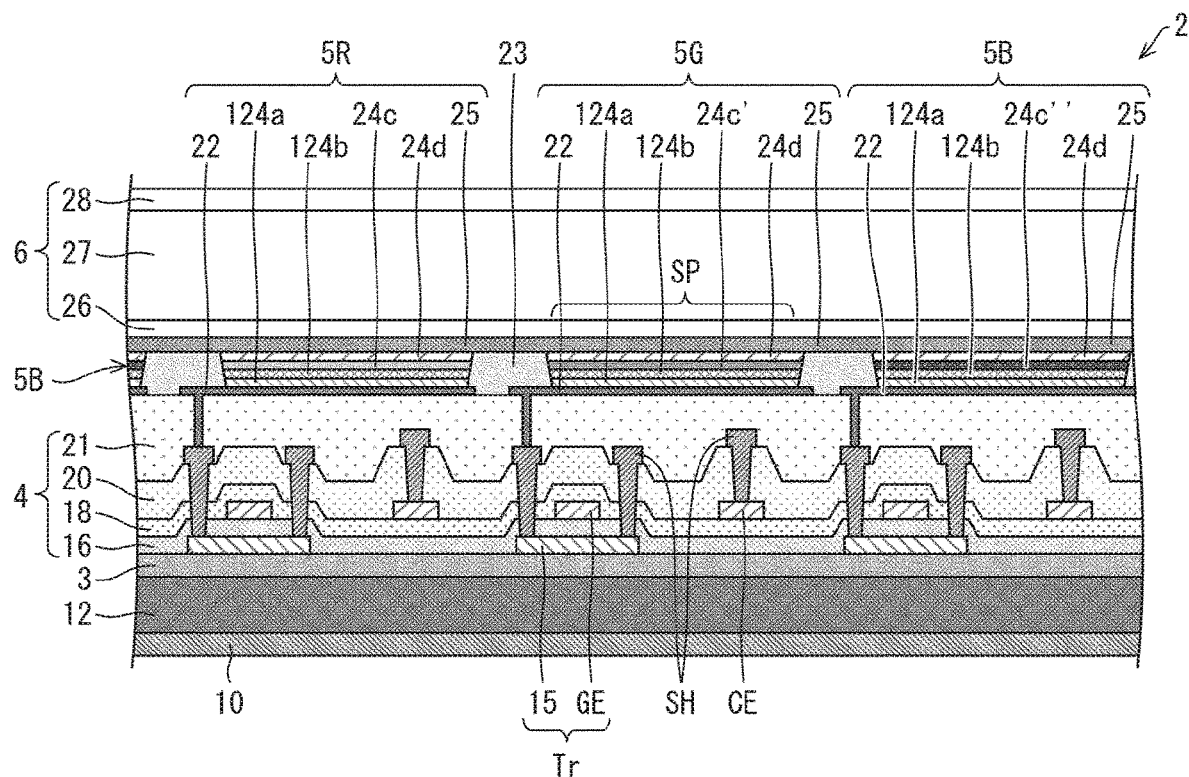
FIG. 1 illustrates a schematic configuration of a display device including a light-emitting element according to a first embodiment.

FIG. 1 illustrates a schematic configuration of a display device 2 including the light-emitting element 5R.

As illustrated in FIG. 1, the display device 2 includes a substrate 10. Stacked on a face of the substrate 10 are: a resin layer 12; a barrier layer 3; a TFT layer 4; light-emitting elements 5R, 5G, and 5B; and a sealing layer 6. Note that, in DESCRIPTION, a direction from the substrate 10 toward the light-emitting elements 5R, 5G, and 5B in FIG. 1 is referred to as an "upward direction", and a direction from the light-emitting layers 5R, 5G, and 5B toward the substrate 10 is referred to as a "downward direction". In other words, the term "lower layer" means that a constituent feature is formed in a previous process before a comparative layer. The term "upper layer" means that a constituent feature is formed in a successive process after a comparative layer. That is, a layer relatively closer to the substrate 10 is a lower layer, and a layer relatively farther away from the substrate 10 is an upper layer.

Exemplary materials of the substrate 10 may include, but not limited to, polyethylene terephthalate (PET) and a glass substrate. In this embodiment, the display device 2 is a flexible display device, and PET is used as a material of the substrate 10. If the display device 2 is an inflexible display device, a glass substrate may be used.

Exemplary materials of the resin layer 12 may include, but not limited to, polyimide resin, epoxy resin, and polyamide resin. In this embodiment, a laser beam is emitted to the resin layer 12 through a support substrate (not shown) to reduce bonding strength between the support substrate (not shown) and the resin layer 12 and remove the support substrate (not shown) from the resin layer 12 (the laser lift off (LLO) technique). The substrate 10 made of PET is attached to a face, of the resin layer 12, from which the support substrate (not shown) is removed. This is how the display device 2 is produced as a flexible display device. However, the resin layer 12 is not required if the display device 2 is produced as an inflexible display device, or a technique other than the LLO technique is used to produce the display device 2 as a flexible display device.

The barrier layer 3 prevents such foreign objects as water and oxygen from reaching the TFT layer 4 and the light-emitting elements 5R, 5G, and 5B when the display device 2 is in use. An example of the barrier layer 3 may include: a silicon oxide film, a silicon nitride film, or a silicon oxide nitride film formed by chemical-vapor deposition (CVD); or a multilayer film including these films.

The TFT layer 4 includes: a semiconductor film 15; an inorganic insulating film 16 (a gate insulating film) formed above the semiconductor film 15; a gate electrode GE formed above the inorganic insulating film 16; an inorganic insulating film 18 formed above the gate electrode GE; a capacitance line CE formed above the inorganic insulating film 18; an inorganic insulating film 20 formed above the capacitance line CE; source and drain lines SH formed above the inorganic insulating film 20 and including source and drain electrodes; and a planarization film 21 formed above the source and drain lines SH.

The semiconductor film 15, the inorganic insulating film 16 (the gate insulating film), the gate electrode GE, the inorganic insulating film 18, the inorganic insulating film 20, and the source and drain wires SH are included in a thin-film transistor element Tr (a TFT element) serving as an active element.

The semiconductor film 15 is formed of, for example, low-temperature polysilicon (LTPS) or an oxide semiconductor. Note that, in FIG. 1, the TFT including the semiconductor film 15 as a channel is of a top gate structure. Alternatively, the TFT may be of a bottom gate structure.

Each of the gate electrode GE, the capacitance electrode CE, the source and drain lines SH, and terminals is a monolayer metal film formed of at least one of such metals as aluminum (Al), tungsten (W), molybdenum (Mo), tantalum (Ta), chromium (Cr), titanium (Ti), and copper (Cu). Alternatively, the electrodes, the lines, and the terminals are a multilayer metal film including these metals.

Each of the inorganic insulating films 16, 18, and 20 can be, for example, a silicon oxide ($SiO_x$) film, a silicon nitride ($SiN_x$) film, or a silicon oxide nitride film formed by the CVD. Alternatively, the inorganic insulating films 16, 18, and 20 can be a multilayer film including these films.

The planarization film (an interlayer insulating film) 21 can be made of an applicable photosensitive organic material such as polyimide resin and acrylic resin.

Of the light-emitting elements 5R, 5G, and 5B included in the display device 2, FIG. 2 illustrates a schematic configuration of the light-emitting element 5R alone as an example. As illustrated in FIG. 1, however, the display device 2 also includes the light-emitting elements 5G and 5B other than the light-emitting element 5R. The light-emitting element 5G is the same in configuration as the light-emitting element 5R except that the light-emitting element 5G includes a light-emitting layer 24c' of a second wavelength range as a light-emitting layer. The light-emitting element 5B is the same in configuration as the light-emitting element 5R except that the light-emitting element 5B includes a light-emitting layer 24c" of a third wavelength range as a light-emitting layer.

In this embodiment, as an example, the light-emitting elements 5R, 5G, and 5B include, but not limited to, the same oxide layers 124a and 124b, and the same electron-transport layer 24d. For example, the oxide layer (the HTL) 124a included in the light-emitting element 5R, the oxide layer (the HTL) 124a included in the light-emitting element 5G, and the oxide layer (the HTL) 124a included in the light-emitting element 5B may be three kinds of different oxide layers (the HTLs), or two kinds of different oxide layers (the HTLs). Moreover, the oxide layer 124b included in the light-emitting element 5R, the oxide layer 124b included in the light-emitting element 5G, and the oxide layer 124b included in the light-emitting element 5B may be three kinds of different second oxide layers, or two kinds of different second oxide layers. Furthermore, the electron-transport layer (the ETL) 24d included in the light-emitting element 5R, the electron-transport layer (the ETL) 24d included in the light-emitting element 5G, and the electron-transport layer (the ETL) 24d included in the light-emitting element 5B may be three kinds of different electron-transport layers (the ETLs), or two kinds of different electron-transport layer (the ETLs).

Each of the light-emitting layer 24c of the first wavelength range, the light-emitting layer 24c' of the second wavelength range, and the light-emitting layer 24c" of the third wavelength range emits a light with a different center wavelength. In this embodiment, as an example, the light-emitting layer 24c of the first wavelength range, the light-emitting layer 24c' of the second wavelength range, and the light-emitting layer 24c" of the third wavelength range respectively emit, but not limited to, a red light, a green light, and a blue light.

Moreover, in this embodiment, the display device 2 includes, as an example, the three kinds of light-emitting elements 5R, 5G, and 5B respectively emitting, but not limited to, a red light, a green light, and a blue light. The light-emitting element 2 may include two or more kinds of light-emitting elements emitting lights in different colors. Alternatively, the display device 2 may include one kind of light-emitting elements.

The light-emitting layer 24c of the first wavelength range, the light-emitting layer 24c' of the second wavelength range, and the light-emitting layer 24c" of the third wavelength range contain a quantum-dot (nano-particle) phosphor. For the sake of brevity, the quantum-dot (nano-particle) phosphor is simply referred to as quantum dots (nano particles). An exemplary specific material of the quantum dots (nano particles) includes any one of CdSe/CdS, CdSe/ZnS, InP/ZnS, or CIGS/ZnS. The quantum dots (nano particles) have a particle size ranging approximately from 3 to 10 nm. Note that, in order to allow the light-emitting layer 24c of the first wavelength, the light-emitting layer 24c' of the second wavelength, and the light-emitting layer 24c" of the third wavelength to emit lights having different center wavelengths, each of the light-emitting layers may contain quantum dots (nano particles) having different particle sizes, or may contain different kinds of quantum dots (nano particles).

In this embodiment, as an example, the light-emitting layer 24c of the first wavelength, the light-emitting layer 24c' of the second wavelength, and the light-emitting layer 24c" of the third wavelength may contain, but not limited to, quantum dots (nano particles). Alternatively, the light-emitting layer 24c of the first wavelength, the light-emitting layer 24c' of the second wavelength, and the light-emitting layer 24c" of the third wavelength may be formed of a light-emitting material for OLEDs.

As illustrated in FIG. 1, each of the light-emitting elements 5R, 5G, and 5B includes: the first electrode 22; the oxide layer 124a; the oxide layer 124b; any one of the light-emitting layer 24c of the first wavelength range, the light-emitting layer 24c' of the second wavelength range, or the light-emitting layer 24c" of the third wavelength range; the electron-transport layer 24d; and the second electrode 25, all of which are stacked one another in the stated order. Note that each of the light-emitting elements 5R, 5G, and 5B can include the features from the first electrode 22 to the second electrode 25 stacked in the reverse order. In such a case, in FIG. 1, the second electrode 25 is disposed in a position of the first electrode 22, and the first electrode 22 is disposed in a position of the second electrode 25. Furthermore, materials of the oxide layers (the HTLs) 124a and the electron-transport layer 24d included in the light-emitting elements 5R, 5G, and 5B will be described later. The oxide layers (the HTLs) and the electron-transport layer 24d of the light-emitting elements 5R, 5G, and 5B do not have to be made of a common material. The layers may be made of different materials. Note that each of the light-emitting elements 5R, 5G, and 5B is a sub-pixel SP of the display device 2.

A bank 23 covering an edge of the first electrode 22 can be made of an applicable photosensitive organic material such as polyimide resin and acrylic resin.

In this embodiment, as an example, the first electrode 22, the oxide layer 124a, the oxide layer 124b, the light-emitting layer 24c of the first wavelength, the light-emitting layer 24c' of the second wavelength, the light-emitting layer 24c" of the third wavelength, and the electron-transport layer 24d are shaped into, but not limited to, islands, except the second electrode 25 shaped into a monolithic common layer. For example, the oxide layer 124a, the oxide layer 124b, the electron-transport layer 24d, and the second electrode 25 may be shaped into monolithic common layers, except the first electrode 22, the light-emitting layer 24c of the first wavelength range, the light-emitting layer 24c' of the second wavelength range, and the light-emitting layer 24c" of the third wavelength range. Note that, in such a case, the bank 23 may be omitted.

Moreover, each of the light-emitting elements 5R, 5G, and 5B does not have to include the electron-transport layer 24d.

The first electrode 22, made of a conductive material, functions as a hole-injection layer (an HIL) to inject holes into the oxide layer 124a serving as a hole-transport layer. The second electrode 25, made of a conductive material, functions as an electron-injection layer (an EIL) to inject electrons into the electron-transport layer 24d.

At least one of the first electrode 22 or the second electrode 25 is made of light-transparent material. Note that either the first electrode 22 or the second electrode 25 may be made of a light-reflective material. If the display device 2 is of a top-emission type, the second electrode 25 as an upper layer is formed of a light-transparent material, and the first electrode 22 as a lower layer is formed of a light-reflective material. If the display device 2 is of a bottom-emission type, the second electrode 25 as an upper layer is formed of a light-reflective material, and the first electrode 22 as a lower layer is formed of a light-transparent material. If the features from the first electrode 22 to the second electrode 25 are stacked in the reverse order, the display device 2 can be: of a top-emission type when the first electrode 22 serving as an upper layer is made of a light-transparent material and the second electrode 25 serving as a lower layer is made of a light-reflective material; and of a bottom-emission type when the first electrode 22 serving as an upper layer is made of a light-reflective material and the second electrode 25 serving as a lower layer is made of a light-transparent material.

An example of the light-transparent material can include a transparent conductive film material. Specifically, the transparent conductive film material can be made of, for example, indium tin oxide (ITO), indium zinc oxide (IZO), ZnO, aluminum-doped zinc oxide (AZO), and boron-doped zinc oxide (BZO). These materials are highly transparent to visible light, improving light emission efficiency.

Preferably, the light-reflective material is highly reflective of visible light. An example of such a material can include a metal material. Specifically, the metal material can include, for example, Al, Cu, Au, and Ag. These materials are highly reflective of visible light, improving light emission efficiency.

Note that either the first electrode 22 or the second electrode 25 may be made of a multilayer stack formed of a light-transparent material and a light-reflective material, such that either the first electrode 22 or the second electrode 25 may be light-reflective.

Note that, in this embodiment, the display device 2 is of a top-emission type. Hence, the second electrode 25 as an upper layer is formed of a light-transparent material, and the first electrode 22 as a lower layer is formed of a light-reflective material.

As to the oxide layer 124a and the oxide layer 124b illustrated in FIGS. 1 and 2, a density of oxygen atoms in the oxide layer 124b is lower than a density of oxygen atoms in the oxide layer 124a. Details of the densities will be described later. In such a case, the oxygen atoms move from the oxide layer 124a toward the oxide layer 124b across the interface between the oxide layer 124a and the oxide layer 124b, such that the electric dipoles are likely to form.

In this embodiment, the oxide layer 124a can be made of an inorganic oxide containing at least one of, for example, nickel oxide or copper-aluminum oxide. Moreover, the oxide layer 124b may be made of an inorganic oxide containing at least one of, for example, strontium oxide, lanthanum oxide, yttrium oxide, silicon oxide, germanium oxide, or a complex oxide containing two or more kinds of cations of these oxides. Moreover, the oxide layer 124b may be made of any one of, for example, strontium oxide, lanthanum oxide, yttrium oxide, silicon oxide, germanium oxide, or a complex oxide containing two or more kinds of cations of these oxides. Furthermore, the oxide layer 124b may be made of an oxide containing any one of elements Sr, La, Y, Si, or Ge with the highest content other than oxygen.

The electron-transport layer 24d transports the electrons and blocks transportation of the holes. A material of the electron-transport layer 24d shall not be limited to a particular one as long as the material is an electron-transporting material. The electron-transporting material can be a known one. The electron-transporting material may be an oxide or a material other than an oxide. An example of the electron-transporting material can include $ZnO$, $TiO_2$, and $SrTiO_3$. The electron-transporting material may also include nano particles. Preferably, the electron-transporting material includes, for example, an n-type semiconductor.

The sealing layer 6 illustrated in FIG. 1 is transparent to light, and includes: a first inorganic sealing film 26 covering the second electrode 25; an organic sealing film 27 formed above the first inorganic sealing film 26; and a second inorganic sealing film 28 covering the organic sealing film 27. The sealing layer 6 covering the light-emitting elements 5R, 5G, and 5B prevents such foreign objects as water and oxygen from penetrating into the light-emitting elements 5R, 5G, and 5B.

An example of the first inorganic sealing film 26 and the second inorganic sealing film 28 may include: a silicon oxide film, a silicon nitride film, or a silicon oxide nitride film formed by the CVD; or a multilayer film including these films. The organic sealing film 27 is a light-transparent organic film thicker than the first inorganic sealing film 26 and the second inorganic sealing film 28. The organic sealing film 27 can be made of an applicable photosensitive organic material such as polyimide resin and acrylic resin.

FIG. 3(a) is an energy band diagram illustrating a hole injection barrier of a light-emitting element according to a comparative example. FIG. 3(b) is an energy band diagram illustrating a hole injection barrier of the light-emitting element 5R.

As illustrated in FIG. 3(a), as to the light-emitting element including the oxide layer 124a and the light-emitting layer 24c of the first wavelength range, directly in contact with the oxide layer 124a, an energy difference ΔEv between an upper end of a valence band of the oxide layer 124a (an HTL valence band) and an upper end of a valence band of the light-emitting layer 24c of the first wavelength range (a light-emitting layer valence band) is large. Since the difference is a height of the hole injection barrier, the holes cannot be injected efficiently.

As illustrated in FIG. 3(b), as to the light-emitting element 5R in which the oxide layer 124b is formed between the oxide layer 124a and the light-emitting layer 24c of the first wavelength range, the density of the oxide atoms in the oxide layer 124b is lower than the density of the oxide atoms in the oxide layer 124a. Hence, the electric dipoles 1 (including a dipole moment oriented from the oxide layer 124b toward the oxide layer 124a) are formed across the interface between the oxide layer 124a and the oxide layer 124b. When the electric dipoles 1 are formed, as illustrated in FIG. 3(b), the electric dipoles 1 cause a shift of a vacuum level at the interface, between the oxide layer 124a and the oxide layer 124b, across which the electric dipoles 1 are formed. As a result, as illustrated in FIG. 3(b), a position of the band of the oxide layer 124a moves downwardly with respect to a position of the band of the light-emitting layer 24c of the first wavelength range. Specifically, the conduction band of the oxide layer 124a (the HTL conduction band) moves to the HTL conduction band', and the valence band of the oxide layer 124a (the HTL valence band) moves to the HTL valence band'. Because of such moves, an energy difference ΔEv' between an upper end of the HTL valence band' of the oxide layer 124a and the upper end of the valence band of the light-emitting layer 24c of the first wavelength range is smaller than ΔEv.

In the light-emitting element 5R, if the oxide layer 124b is sufficiently thin, the holes can be transported through the oxide layer 124b by tunneling. Hence, the height of the hole barrier between the oxide layer 124a and the light-emitting layer 24c of the first wavelength range is effectively the energy difference ΔEv' between the upper end of the HTL valence band' of the oxide layer 124a and the upper end of the valence band of the light-emitting layer 24c of the first wavelength range. Hence, when the oxide layer 124b is formed in the light-emitting element 5R, the holes can be efficiently injected from the oxide layer 124a into the light-emitting layer 24c of the first wavelength range.

The oxide layer 124b has a film thickness of preferably 0.2 nm or more and 5 nm or less. When the film thickness is 5 nm or less, the tunneling of the holes can be efficiently carried out. Moreover, when the film thickness is 0.2 nm or more, a sufficiently large dipole moment can be obtained. Furthermore, the film thickness is preferably 0.8 nm or more and less than 3 nm. In such a case, the holes can be injected more efficiently.

The oxide layer (the HTL) 124a, which is a hole-transport layer, is made of semiconductor. The oxide layer (the HTL) 124a is preferably made of a p-type semiconductor. In such a case, the oxide layer (the HTL) 124a has a bandgap indicated by the semiconductor. The carriers of the oxide layer 124a are the holes. The oxide layer 124a serving as a hole-transport layer has a carrier density (a density of the holes) of preferably $1\times10^{13}$ cm$^3$ or higher. Moreover, the oxide layer 124a serving as a hole-transport layer has a carrier density (a density of the holes) of preferably $3\times10^{17}$ cm$^3$ or lower. Meanwhile, preferably, the oxide layer 124b has a bandgap larger than a bandgap of the oxide layer (the HTL) 124a. More preferably, the oxide layer 124b is an insulator. Described in this embodiment as an example is a case where the oxide layer 124b is an insulator.

As illustrated in FIG. 3(b), an ionization potential IP1 of the oxide layer 124a is smaller than an ionization potential IP2 of the light-emitting layer 24c of the first wavelength range. An ionization potential IP3 of the oxide layer 124b is larger than an ionization potential IP2 of the light-emitting layer 24c of the first wavelength range.

Moreover, as illustrated in FIG. 3(b), an energy difference (a bandgap) between a lower end of a conduction band and an upper end of a valence band in the oxide layer 124b is larger than an energy difference (a bandgap) between a lower end of an HTL conduction band' and an upper end of an HTL valence band' in the oxide layer 124a. Hence, the oxide layer 124b is lower in carrier density and higher in insulation than the oxide layer 124a. Hence, in the oxide layer 124b, the holes are transported by tunneling. As can be seen, the density of the holes in the oxide layer 124a serving as a hole-transport layer is higher than the density of the holes in the oxide layer 124b. The holes are injected into the light-emitting layer 24c of the first wavelength range by tunneling through the oxide layer 124b.

Note that, in FIG. 3(b), described as an example is only the light-emitting element 5R including the light-emitting layer 24c of the first wavelength range. When the oxide layer 124b is formed also in the light-emitting element 5G including the light-emitting layer 24c' of the second wavelength and in the light-emitting element 5B including the light-emitting layer 24c" of the third wavelength range, the holes can be injected efficiently as seen in the light-emitting element 5R including the light-emitting layer 24c of the first wavelength range.

FIG. 5(a) is a table showing examples of inorganic oxides included in a common hole-transport layer, and densities of the oxygen atoms in the inorganic oxides. FIG. 5(b) is a table showing examples of typical inorganic oxides and densities of the oxygen atoms in the typical inorganic oxides. Note that the inorganic oxides listed in FIG. 5(a) are p-type semiconductors, and the inorganic oxides listed in FIG. 5(b) are insulators.

FIG. 6 is a table showing materials to be selected for the oxide layer 124a from among the examples of the inorganic oxides listed in FIG. 5(a) and included in the common hole-transport layer, and materials to be selected for the oxide layer 124b from among the examples of the typical inorganic oxides listed in FIG. 5(b).

In this embodiment, the density of the oxygen atoms in the oxide layer 124b is lower than the density of the oxygen atoms in the oxide layer 124a. Hence, the oxide layer 124a can be made of an inorganic oxide containing at least one of, for example, nickel oxide or copper-aluminum oxide. The oxide layer 124b can be made of an inorganic oxide containing at least one of, for example, strontium oxide, lanthanum oxide, yttrium oxide, silicon oxide, germanium oxide, or a complex oxide containing two or more kinds of cations of these oxides. The oxide layer (the HTL) 124a made of such materials has a bandgap in a range that the semiconductor indicates.

The oxide layer 124b may be formed of any one of strontium oxide (e.g. SrO), lanthanum oxide (e.g. $La_2O_3$), yttrium oxide (e.g. $Y_2O_3$), silicon oxide (e.g. $SiO_2$), germanium oxide (e.g. $GeO_2$), or a complex oxide containing two or more kinds of cations of these oxides.

Furthermore, the oxide layer 124b may be formed of an oxide containing any one or more of elements Sr, La, Y, Si, and Ge as main components.

Furthermore, the oxide layer 124b may be formed of an oxide containing any one of elements Sr, La, Y, Si, or Ge with the highest content other than oxygen.

Note that the combinations of the oxide layer 124a and the oxide layer 124b are examples. The combinations shall not be limited to the above exemplary combinations as long as the density of the oxygen atoms in the oxide layer 124b is lower than the density of the oxygen atoms in the oxide layer 124a.

When the density of the oxygen atoms in the oxide layer 124b is lower than the density of the oxygen atoms in the oxide layer 124a, the electric dipoles 1, including a dipole moment oriented from the oxide layer 124b toward the oxide layer 124a, are easily formed. Such a feature makes it possible to improve efficiency of hole injection.

In view of facilitating the formation of the electric dipoles 1 (see FIG. 4(b)) including a dipole moment oriented from the oxide layer 124b toward the oxide layer 124a and of improving efficiency of hole injection, the density of the oxygen atoms in the oxide layer 124b is preferably lower than or equal to 90% of the density of the oxygen atoms in the oxide layer 124a, and, more preferably, lower than or equal to 80% of the density of the oxygen atoms in the oxide layer 124a. Still more preferably, the density of the oxygen atoms in the oxide layer 124b is lower than or equal to 75% of the density of the oxygen atoms in the oxide layer 124a, and, yet still more preferably, lower than or equal to 70%.

Moreover, the density of the oxygen atoms in the oxide layer 124b is higher than or equal to 50% of the density of the oxygen atoms in the oxide layer 124a. Such a feature makes it possible to reduce formation of a recombination center, with, for example, a dangling bond, on the interface between the oxide layer 124a and the oxide layer 124b.

Note that a density of oxygen atoms in an oxide layer according to the present application is a density of oxygen atoms of a bulk of a material included in the oxide layer 124a or the oxide layer 124b, as a unique value that the oxide layer 124a or the oxide layer 124b has. For example, to the materials listed in FIG. 5, the densities of the oxygen atoms listed in FIG. 5 are applied. Note that a density of oxygen atoms in a complex oxide can be obtained as follows: For all the cations contained in the complex oxide, a density of the oxygen atoms included in an oxide of each cation alone is multiplied by a composition rate of each of the cations with respect to all the cations included in the complex oxide, and obtained products are added up. Then, a weighted average of the sum is calculated so that the density of the oxygen atoms in the complex oxide can be obtained.

Second Embodiment

Figure 7:
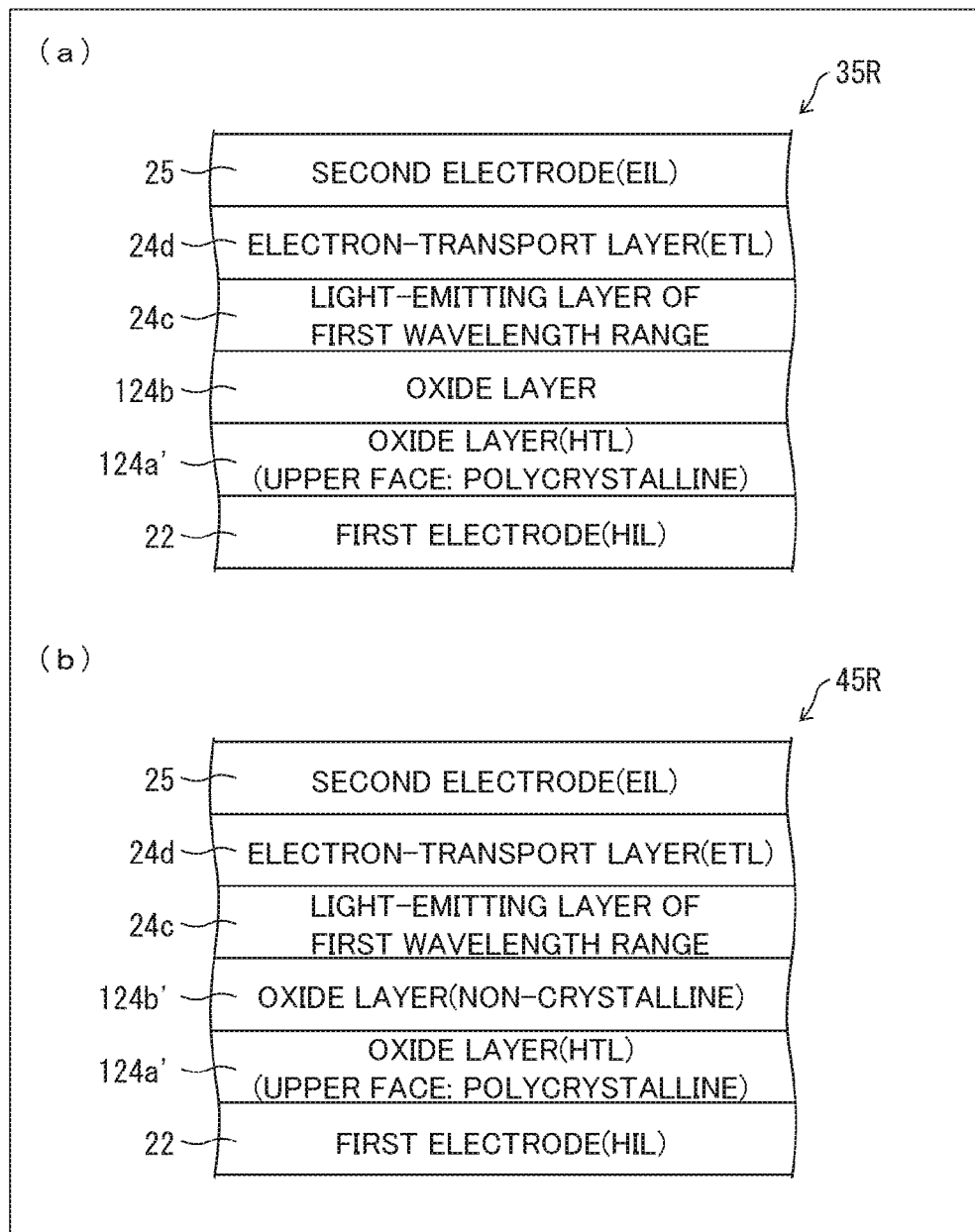
FIG. 7($a$) illustrates a schematic configuration of a light-emitting element according to a second embodiment.

Next, with reference to FIG. 7, a second embodiment of disclosure is described. The second embodiment is different from the first embodiment in that: (i) in a light-emitting element 35R according to the second embodiment, an upper face of an oxide layer (the first oxide layer) 124a' in contact with the oxide layer (the second oxide layer) 124b contains grains; and (ii) in a light-emitting element 45R according to the second embodiment, an oxide layer (the second oxide layer) 124b' is amorphous, and an upper face of the oxide layer (the first oxide layer) 124a' in contact with the oxide layer 124b' contains grains. That is, the oxide layers 124a' and 124b' respectively correspond to the oxide layers 124a and 124b according to the first embodiment, and can be made of the same materials as those of the oxide layers 124a and 124b according to the first embodiment. Note that, for the sake of description, the same reference signs are used to denote components having the same functions as the functions of the components illustrated in the drawings in the first embodiment. Description of such components will be omitted.

FIG. 7(a) illustrates a schematic configuration of the light-emitting element 35R. FIG. 7(b) illustrates a schematic configuration of the light-emitting element 45R.

In the light-emitting element 35R illustrated in FIG. 7(a), the first electrode 22 is positioned below the light-emitting layer 24c of the first wavelength range. The second electrode 25 is positioned above the light-emitting layer 24c of the first wavelength range. A portion of at least the upper face of the oxide layer 124a' in contact with the oxide layer 124b is polycrystalline. That is, the upper face of the oxide layer 124a' contains grains. The grains contained in the upper face of the oxide layer 124a' increase an area of an interface between the upper face of the oxide layer 124a' and the oxide layer 124b. Such a feature makes it possible to form electric dipoles more efficiently. Hence, in the light-emitting element 35R, the holes can be injected efficiently from the oxide layer 124a' into the light-emitting layer 24c of the first wavelength.

In the light-emitting element 45R illustrated in FIG. 7(b), the first electrode 22 is positioned below the light-emitting layer 24c of the first wavelength range. The second electrode 25 is positioned above the light-emitting layer 24c of the first wavelength range. A portion of at least the upper face of the oxide layer 124a' in contact with the oxide layer 124b is polycrystalline. That is, the upper face of the oxide layer 124a' contains grains. The oxide layer 124b' is made of an amorphous oxide.

The amorphous oxide of the oxide layer 124b' allows the oxide layer 124b' to have greater uniformity in film thickness. Such a feature makes it possible to transport the holes more uniformly in the oxide layer 124b' by tunneling. The grains contained in the upper face of the oxide layer 124a' increase an area of an interface between the upper face of the oxide layer 124a' and the oxide layer 124b'. Such a feature makes it possible to form electric dipoles more efficiently. Hence, in the light-emitting element 45R, the holes can be efficiently injected from the oxide layer 124a' into the light-emitting layer 24c of the first wavelength range.

Note that, in this embodiment, a laser beam is used to thermally treat a portion including the upper face of the oxide layer 124a' in order to polycrystallize the upper face of the oxide layer 124a'. However, the technique of the polycrystallization shall not be limited to such a technique. The technique to polycrystallize the oxide layer 124a' and the kind of a polycrystalline oxide contained in the oxide layer 124a' shall not be limited to a particular technique and a particular kind, as long as the densities of the oxygen atoms in the oxide layers 124b and 124b' are lower than the density of the oxygen atoms in the oxide layer 124a'.

In this embodiment, described as an example is, but not limited to, a case where the upper face of the oxide layer 124a' is polycrystallized to have grains. Alternatively, for example, a technique such as sputtering and the CVD may be used to take advantage of voluntary growth of the nuclei to form the grains in a portion of at least the upper face of the oxide layer 124a'.

In this embodiment, described as an example is, but not limited to, a case where the upper face of the oxide layer 124a' is polycrystallized. Alternatively, the oxide layer 124a' may entirely be made of a polycrystalline oxide.

In this embodiment, described as an example is, but not limited to, a case where the upper face of the oxide layer 124a' contains grains. Alternatively, the oxide layer 124a' may entirely contain grains.

Note that, in the upper face of the oxide layer 124a', the grains may discretely be distributed. Moreover, the grains may be crystal grains containing crystals or amorphous phases.

Other than the above features, the second embodiment is the same as the first embodiment. Hence, the second embodiment will not be elaborated upon any further here.

Third Embodiment

Figure 8:
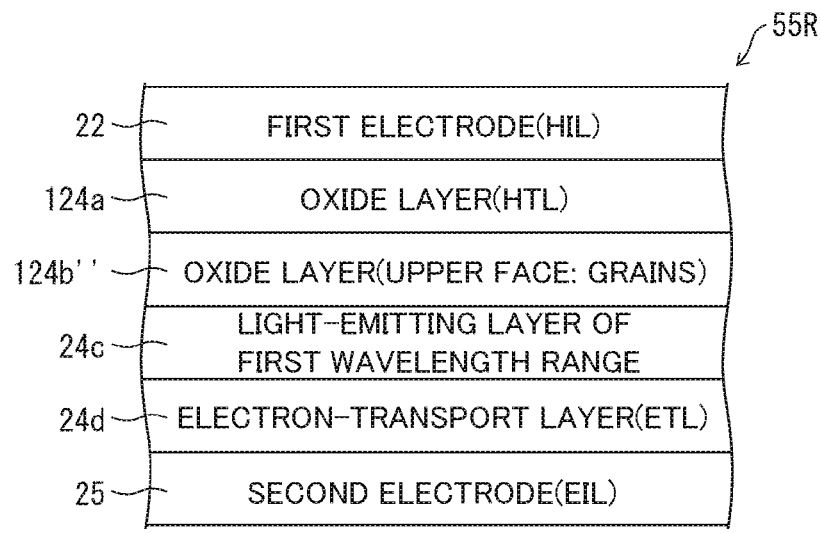
FIG. 8 illustrates a schematic configuration of a light-emitting element according to a third embodiment.

Next, with reference to FIG. 8, a third embodiment of disclosure is described. The third embodiment is different from the first and second embodiments in that: (i) in a light-emitting element 55R according to the third embodiment, the second electrode 25, the electron-transport layer 24d, the light-emitting layer 24c of the first wavelength range, an oxide layer (the second oxide layer) 124b", the oxide layer (the first oxide layer) 124a, and the first electrode 22 are stacked on top of another in the stated order from below upwards; and (ii) at least an upper face of the oxide layer 124b" contains grains. That is, the oxide layer 124b" corresponds to the oxide layers 124b and 124b' according to the first and second embodiments, and can be made of the same material as the materials of the oxide layers 124b and 124b'. Note that, for the sake of description, the same reference signs are used to denote components having the same functions as the functions of the components illustrated in the drawings in the first and second embodiments. Description of such components will be omitted.

FIG. 8 illustrates a schematic configuration of the light-emitting element 55R.

In the light-emitting element 55R illustrated in FIG. 8, the second electrode 25 formed of a light-transparent material is positioned below the first electrode 22 formed of a light-reflective material. Hence, the light-emitting element 55R can be used for a bottom-emission display device. As a matter of course, the configuration of the light-emitting element 55R shall not be limited to the above one. As seen in the light-emitting element 5R, at least one of the first electrode 22 or the second electrode 25 may be formed of a light-transparent material, and either the first electrode 22 or the second electrode 25 may be formed of a light-reflective material. Note that, in the display device including the light-emitting element 55R, the first electrode 22 is formed as a monolithic common layer, and the second electrode 25 electrically connected to a thin-film transistor element (a TFT element) is shaped into an island for each of the sub-pixels.

In the light-emitting element 55R, the first electrode 22 is positioned above the light-emitting layer 24c of the first wavelength range. The second electrode 25 is positioned below the light-emitting layer 24c of the first wavelength range. At least an upper face of the oxide layer 124b" in contact with the oxide layer 124a contains grains. In the oxide layer 124b", the grains may discretely be distributed. Moreover, the grains may be crystal grains containing crystals or amorphous phases.

In this embodiment, described as an example is, but not limited to, a case where the upper face of the oxide layer 124b" in contact with the oxide layer 124a contains grains. Alternatively, the oxide layer 124b" may entirely contain grains.

Note that, in this embodiment, a laser beam is used to thermally treat at least a portion including the upper face of the oxide layer 124b" in order to polycrystallize a portion of at least the upper face of the oxide layer 124b" so that the upper face of the oxide layer 124b" contains grains. However, the technique of forming grains shall not be limited to such a technique. For example, a technique such as sputtering and the CVD may be used to take advantage of voluntary growth of the nuclei to form the grains. The technique to form the oxide layer 124b" to contain grains, and the kind of the oxide layer 124b" shall not be limited to a particular technique and a particular kind, as long as the density of the oxygen atoms in the oxide layers 124b" is lower than the density of the oxygen atoms in the oxide layer 124a. The oxide layer 124b" may entirely be polycrystalline.

The grains contained in the upper face of the oxide layer 124b" in contact with the oxide layer 124a increase an area of the interface between the oxide layer 124a and the upper face of the oxide layer 124b". Such a feature makes it possible to form electric dipoles more efficiently. Hence, in the light-emitting element 55R, the holes can be injected efficiently from the oxide layer 124a into the light-emitting layer 24c of the first wavelength.

The oxide layer 124a may be made of an amorphous oxide. The amorphous oxide contained in the oxide layer 124a can provide excellent coverage on the oxide layer 124b" having grains. Such a feature facilitates formation of the electric dipoles 1. Moreover, the amorphous oxide of the oxide layer 124a allows the oxide layer 124a to have greater uniformity in film thickness. Such a feature makes it possible to transport the holes more uniformly in the oxide layer 124a. Even if the oxide layer 124a is made of an amorphous oxide, the upper face of the oxide layer 124b" contains grain. The grains increase an area of the interface between the oxide layers 124a and 124b", making it possible to form the electric dipoles more efficiently. Hence, in the light-emitting element 55R, the holes can be efficiently injected from the oxide layer 124a into the light-emitting layer 24c of the first wavelength range.

Other than the above features, the third embodiment is the same as the first and second embodiments. Hence, the third embodiment will not be elaborated upon any further here.

Fourth Embodiment

Figure 9:
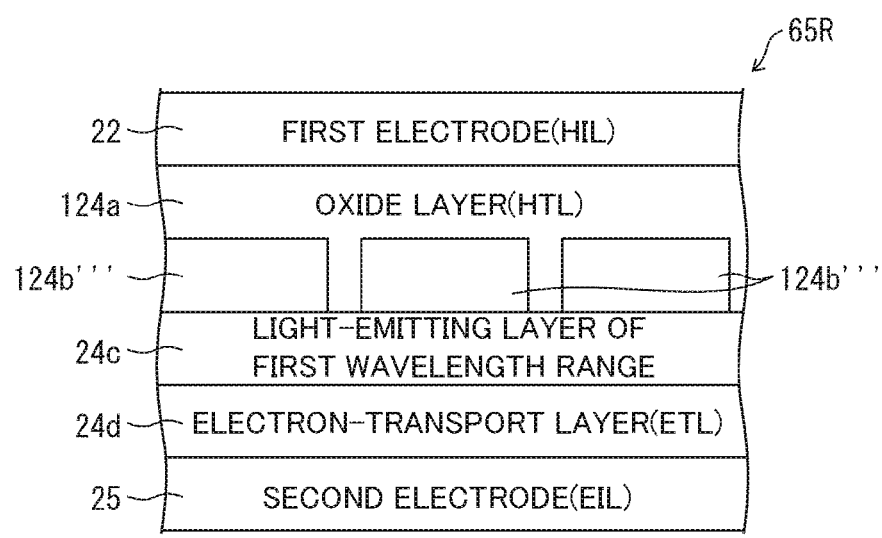
FIG. 9 illustrates a schematic configuration of a light-emitting element according to a fourth embodiment.
Figure 10:
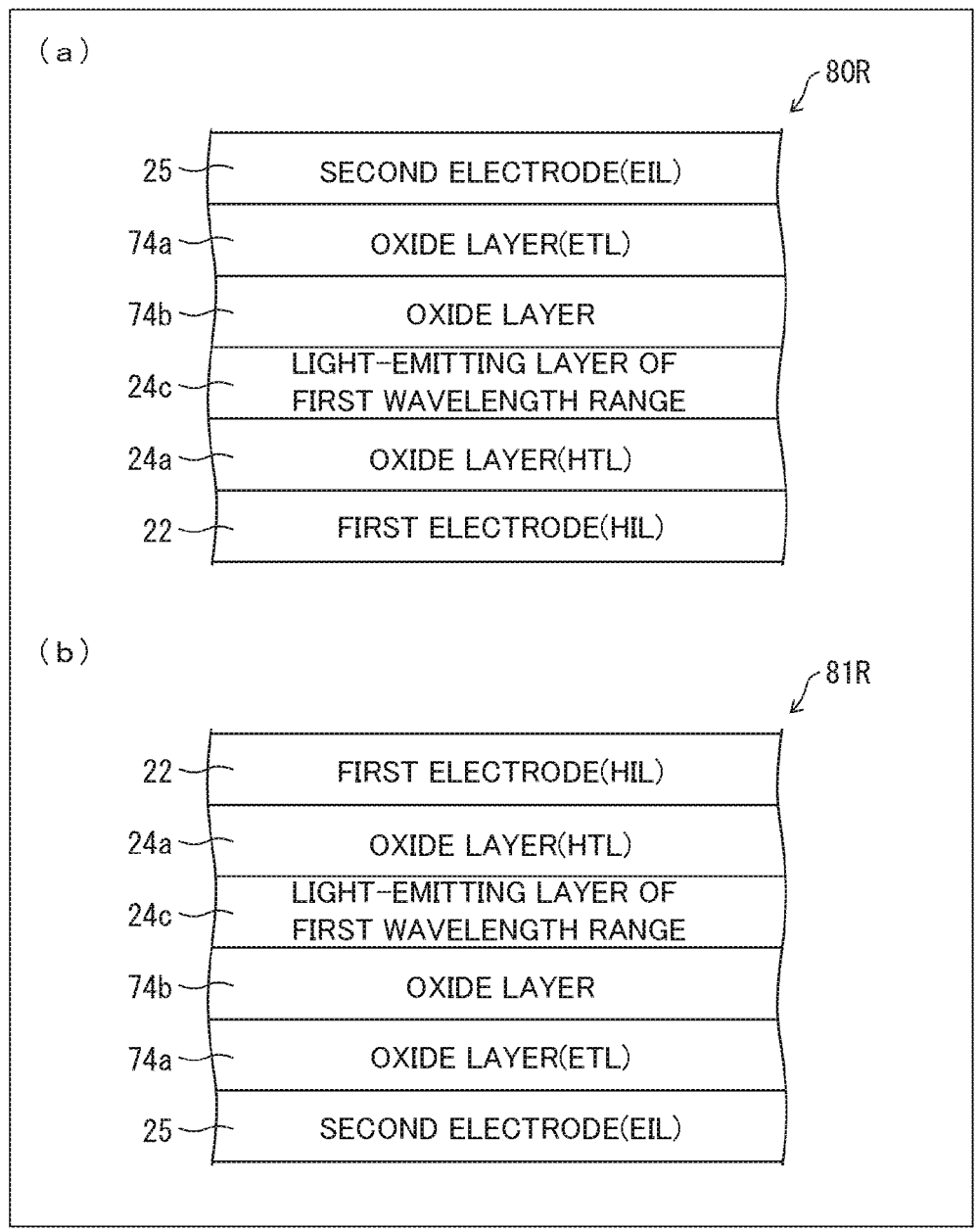
FIG. 10($a$) illustrates a schematic configuration of a light-emitting element according to a fifth embodiment.
Figure 11:
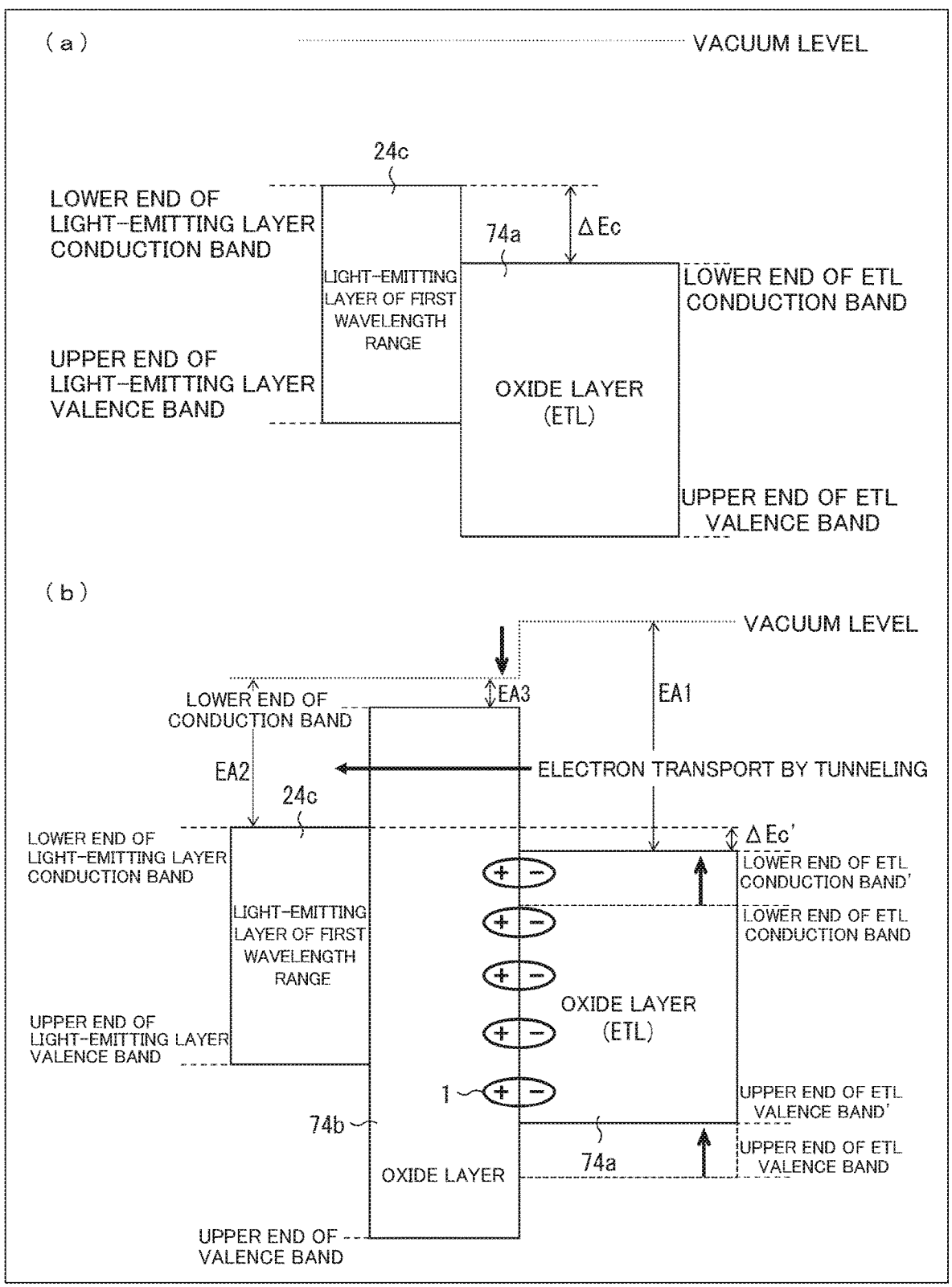
FIG. 11($a$) is an energy band diagram illustrating an electron injection barrier of a light-emitting element according to a comparative example.
Figure 12:
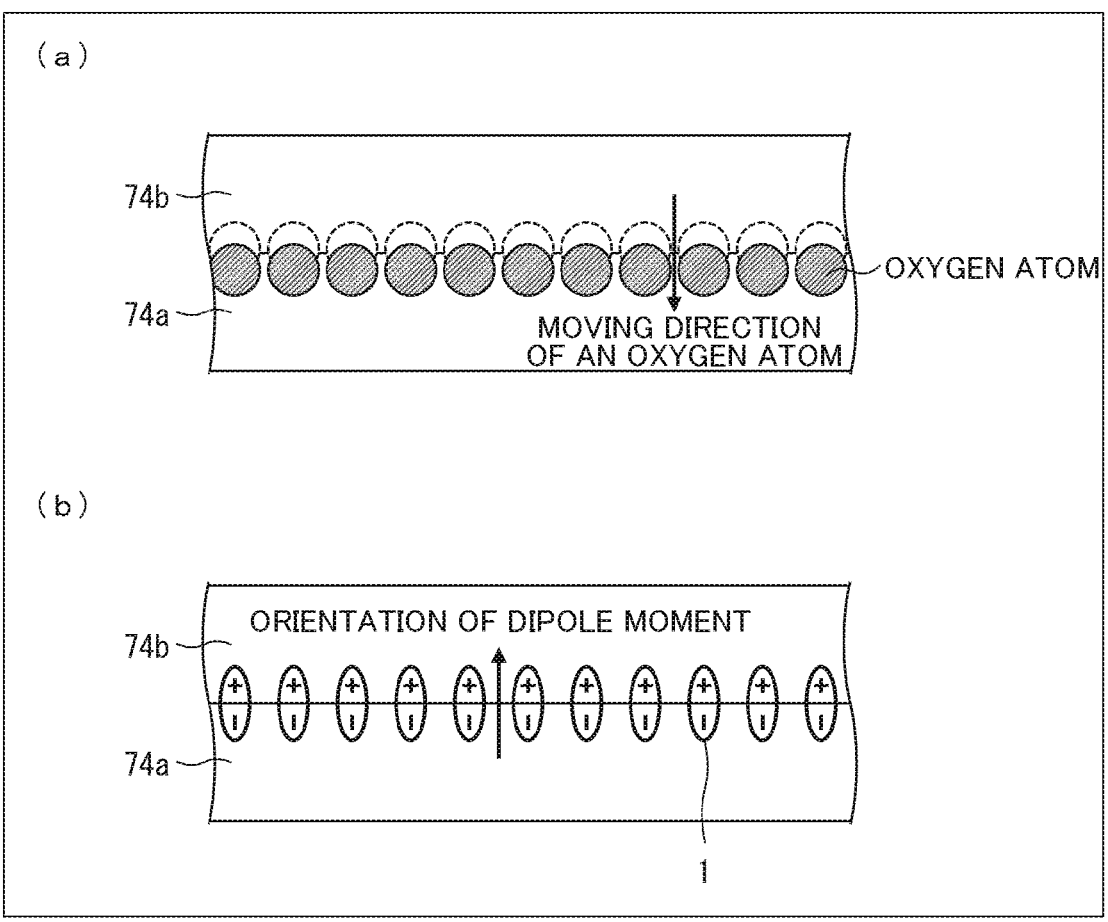
FIG. 12($a$) illustrates a mechanism of how oxygen atoms move across an interface between oxide layers illustrated in FIG. 11($b$).

Next, with reference to FIG. 9, a fourth embodiment of disclosure is described. The fourth embodiment is different from the first to third embodiments in that a light-emitting element 65R according to the fourth embodiment includes a plurality of oxide layers (second oxide layers) 124b''' shaped into islands and formed in contact with the oxide layer (the first oxide layer) 124a. That is, the oxide layers 124b''' correspond to the oxide layers 124b, 124b', and 124b" according to the first to third embodiments, and can be made of the same material as the materials of the oxide layers 124b, 124b', and 124b". Note that, for the sake of description, the same reference signs are used to denote components having the same functions as the functions of the components illustrated in the drawings in the first to third embodiments. Description of such components will be omitted.

FIG. 9 illustrates a schematic configuration of the light-emitting element 65R.

As seen in the light-emitting element 5R illustrated in FIG. 2, in the light-emitting element 65R illustrated in FIG.

9, at least one of the first electrode 22 or the second electrode 25 may be formed of a light-transparent material, and either the first electrode 22 or the second electrode 25 may be formed of a light-reflective material. Note that, in the display device including the light-emitting element 65R, the first electrode 22 is formed as a monolithic common layer, and the second electrode 25 electrically connected to a thin-film transistor element (a TFT element) is shaped into an island for each of the sub-pixels.

In the light-emitting element 65R illustrated in FIG. 9, the first electrode 22 is positioned above the light-emitting layer 24c of the first wavelength range. The second electrode 25 is positioned below the light-emitting layer 24c of the first wavelength range. The oxide layers 124b''' in contact with the oxide layer 124a are shaped into islands. The oxide layers 124b''' can be shaped into islands by voluntary growth of the nuclei, using techniques such as sputtering and the CVD. Moreover, a thin film may be formed, and, after that, the thin film may be processed to be shaped into islands by, for example, etching. Furthermore, when the oxide layers 124b''' are patterned to be shaped into islands, the patterning step may be carried out to increase surface roughness of the oxide layers 124b'''.

A density of oxygen atoms in the oxide layers 124b''' is lower than the density of the oxygen atoms in the oxide layer 124a. The oxide layers 124b''' are shaped into a plurality of islands, increasing an area of an interface between the oxide layers 124b''' and the oxide layer 124a. Such a feature makes it possible to form electric dipoles more efficiently. Hence, in the light-emitting element 65R, the holes can be injected efficiently from the oxide layer 124a into the light-emitting layer 24c of the first wavelength.

The oxide layer 124a may be made of an amorphous oxide. The amorphous oxide contained in the oxide layer 124a can provide excellent coverage on the oxide layers 124b''' shaped into islands. Such a feature facilitates formation of the electric dipoles 1. Moreover, the amorphous oxide of the oxide layer 124a allows the oxide layer 124a to have greater uniformity in film thickness. Such a feature makes it possible to transport the holes more uniformly in the oxide layer 124a. Even if the oxide layer 124a is made of an amorphous oxide, the oxide layers 124b''' are shaped into a plurality of islands. The oxide layers 124b''' increase an area of an interface between the oxide layer 124a and the oxide layers 124b''', making it possible to form the electric dipoles more efficiently. Hence, in the light-emitting element 65R, the holes can be efficiently injected from the oxide layer 124a into the light-emitting layer 24c of the first wavelength range.

Other than the above features, the fourth embodiment is the same as the first to third embodiments. Hence, the fourth embodiment will not be elaborated upon any further here.

Fifth Embodiment

Next, with reference to FIGS. 10 to 14, a fifth embodiment of disclosure is described. The fifth embodiment is different from the first to fourth embodiments in that light-emitting elements 80R and 81R according to the fifth embodiment each include: an oxide layer (an ETL, namely, the second oxide layer) 74a made of an n-type semiconductor; and an oxide layer (the first oxide layer) 74b. The oxide layers 74a and 74b are provided between the second electrode 25 and the light-emitting layer 24c of the first wavelength range, and stacked one another in the stated order from toward the second electrode 25. Note that, for the sake of description, the same reference signs are used to denote components having the same functions as the functions of the components illustrated in the drawings in the first to fourth embodiments. Description of such components will be omitted.

FIG. 10(a) illustrates a schematic configuration of the light-emitting element 80R according to the fifth embodiment. FIG. 10(b) illustrates a schematic configuration of the light-emitting element 81R according to the fifth embodiment.

As illustrated in FIG. 10(a) and FIG. 10(b), each of the light-emitting elements 80R and 81R includes: the first electrode (the hole-injection layer: the HIL) 22; the second electrode (the electron-injection layer: the EIL) 25; and the light-emitting layer 24c, of the first wavelength range, provided between the first electrode 22 and the second electrode 25. Between the second electrode 25 and the light-emitting layer 24c of the first wavelength range, the oxide layer (the ETL) 74a; namely, an electron-transport layer, and the oxide layer 74b are stacked one another in the stated order from toward the second electrode 25. As will be described later, a density of oxygen atoms in the oxide layer (the ETL) 74a is lower than a density of oxygen atoms in the oxide layer 74b. Note that, between the light-emitting layer 24c of the first wavelength range and the first electrode 22, an oxide layer (an ETL) 24a is provided.

In this embodiment, for example, the first electrode 22 is made of a light-reflective material, and the second electrode 25 is made of a light-transparent material. Hence, the display device can be of a top-emission type using the light-emitting element 80R, and of a bottom-emission type using the light-emitting element 81R. As a matter of course, the configurations of the light-emitting elements 80R and 81R shall not be limited to the above ones. As seen in the light-emitting element 5R illustrated in FIG. 2, at least one of the first electrode 22 or the second electrode 25 may be formed of a light-transparent material, and either the first electrode 22 or the second electrode 25 may be formed of a light-reflective material.

The oxide layer (the ETL) 74a, which is an electron-transport layer, is made of a semiconductor. The oxide layer (the ETL) 74a is preferably made of an n-type semiconductor. In such a case, the oxide layer (the ETL) 74a has a bandgap in a range that the semiconductor indicates. The carriers of the oxide layer 74a are the electrons. The oxide layer (the ETL) 74a is preferably made of an inorganic oxide. The oxide layer (the ETL) 74a can be made of such materials as, for example, zinc oxide (e.g. ZnO), titanium oxide ($TiO_2$), indium oxide (e.g. $In_2O_3$), tin oxide (e.g. $SnO_2$), and strontium titanate (e.g. $SrTiO_3$). Furthermore, the oxide layer (the ETL) 74a may be made of an oxide containing any one or more of elements Zn, In, Sn, and Ti as main components. Moreover, the oxide layer (the ETL) 74a may be made of an oxide containing any one of elements Zn, In, Sn, or Ti with the highest content other than oxygen. The above materials described as examples are inorganic oxides and n-type semiconductors. The oxide layer (the ETL) 74a made of such materials has a bandgap in a range that the semiconductor indicates.

Meanwhile, the oxide layer 74b is made of an oxide. The oxide layer 74b is preferably made of an inorganic oxide. Furthermore, preferably, the oxide layer 74b has a bandgap larger than a bandgap of the oxide layer (the ETL) 74a. More preferably, the oxide layer 74b is made of an insulator. Described in this embodiment as an example is a case where the oxide layer 74b is an insulator.

Preferably, the oxide layer 74b may contain at least one of aluminum oxide, gallium oxide, tantalum oxide, zirconium oxide, hafnium oxide, magnesium oxide, germanium oxide, silicon oxide, or a complex oxide containing two or more kinds of cations of these oxides. Preferably, the oxide layer 74b may be made of at least one of aluminum oxide, gallium oxide, tantalum oxide, zirconium oxide, hafnium oxide, magnesium oxide, germanium oxide, silicon oxide, or a complex oxide containing two or more kinds of cations of these oxides. Moreover, preferably, the oxide layer 74b is made of an oxide containing any one or more of elements Al, Ti, Ga, Ta, Zr, Hf, Mg, Ge, and Si as main components. Furthermore, preferably, the oxide layer 74b is made of an oxide containing any one of elements Al, Ti, Ga, Ta, Zr, Hf, Mg, Ge, or Si with the highest content other than oxygen. The above materials described as examples are inorganic oxides and insulators.

The density of the oxygen atoms in the oxide layer 74a is lower than the density of the oxygen atoms in the oxide layer 74b. In such a case, the oxygen atoms move from the oxide layer 74b toward the oxide layer (the ETL) 74a across the interface between the oxide layer 74a and the oxide layer 74b. Hence, the electric dipoles 1 (having a dipole moment oriented from the oxide layer (the ETL) 74a toward the oxide layer 74b) are likely to form.

Note that, the oxide layer (the HTL) 24a transports the holes and blocks transportation of the electrons. The oxide layer (the HTL) 24a can be made of such materials as NiO, $CuAlO_2$, PEDOT:PSS, and PVK. The oxide layer (the HTL) 24a may be made of nano particles.

Note that the oxide layer 74a (the second oxide layer) is preferably made of an inorganic oxide, such that long-time reliability of the light-emitting element improves. That is, the light emission efficiency of the light-emitting element improves after aging. The oxide layer 74b (the first oxide layer) is preferably made of an inorganic oxide, such that long-time reliability of the light-emitting element improves. That is, the light emission efficiency of the light-emitting element improves after aging. Furthermore, the oxide layer 74b is preferably made of an insulator. That is, either the first oxide layer (the oxide layer 74b) or the second oxide layer (the oxide layer 74a) whichever closer to the light-emitting layer (the light-emitting layer 24c of the first wavelength range) is preferably made of an insulator, such that long-time reliability of the light-emitting element improves.

FIG. 12(a) illustrates a mechanism of how oxygen atoms move across the interface between the oxide layer (the ETL) 74a and the oxide layer 74b. FIG. 12(b) illustrates the electric dipoles 1 formed, with the motion of the oxygen atoms, on the interface between the oxide layers 74a and 74b.

As illustrated in FIG. 12(a), the density of the oxide atoms in the oxide layer 74a is lower than the density of the oxide atoms in the oxide layer 74b. Hence, when the oxide layer 74a and the oxide layer 74b are formed in contact with each other, the oxygen atoms are likely to move from the oxide layer 74b toward the oxide layer 74a across the interface between the oxide layer 74b and the oxide layer 74a. When the oxygen atoms move, the oxygen vacancies are charged positively and the moved oxygen atoms are charged negatively.

Hence, as illustrated in FIG. 12(b), across the interface between the oxide layer 74a and the oxide layer 74b, the electric dipoles 1 are generated to include a dipole moment oriented from the oxide layer 74a toward the oxide layer 74b.

In view of facilitating the formation of the electric dipoles 1 (see FIG. 12(b)) including a dipole moment oriented from the oxide layer 74a toward the oxide layer 74b and of improving the efficiency of the electron injection, the density of the oxygen atoms in the oxide layer 74a is preferably lower than or equal to 95% of the density of the oxygen atoms in the oxide layer 74b, and, more preferably, lower than or equal to 84% of the density of the oxygen atoms in the oxide layer 74b. Still more preferably, the density of the oxygen atoms in the oxide layer 74a is lower than or equal to 80% of the density of the oxygen atoms in the oxide layer 74b, yet still more preferably, lower than or equal to 75%, and yet still more preferably, lower than or equal to 70%.

Moreover, the density of the oxygen atoms in the oxide layer 74a is higher than or equal to 50% of the density of the oxygen atoms in the oxide layer 74b. Such a feature makes it possible to reduce formation of a recombination center, with, for example, a dangling bond, on the interface between the oxide layer 74a and the oxide layer 74b.

FIG. 11(a) is an energy band diagram illustrating an electron injection barrier of a light-emitting element according to a comparative example. FIG. 11(b) is an energy band diagram illustrating an electron injection barrier of the light-emitting elements 80R and 81R according to the fifth embodiment.

As illustrated in FIG. 11(a), as to the light-emitting element of the comparative example including the oxide layer (the ETL) 74a and the light-emitting layer 24c, of the first wavelength range, directly in contact with the oxide layer 74a, an energy difference $\Delta Ec$ between an lower end of a conduction band of the oxide layer 24c of the first wavelength range (a light-emitting layer conduction band) and a lower end of a conduction band of the oxide layer 74a (an ETL conduction band) is large. Since the energy difference $\Delta Ec$ is a height of the electron injection barrier, the electrons cannot be injected efficiently.

As illustrated in FIG. 11(b), as to the light-emitting elements 80R and 81R in which the oxide layer 74b is formed between the oxide layer (the ETL) 74a and the light-emitting layer 24c of the first wavelength range, the density of the oxide atoms in the oxide layer 74a is lower than the density of the oxide atoms in the oxide layer 74b. Hence, the electric dipoles 1 (including a dipole moment oriented from the oxide layer 74a toward the oxide layer 74b) are formed across the interface between the oxide layer 74a and the oxide layer 74b. When the electric dipoles 1 are formed, the electric dipoles 1 cause a shift of a vacuum level on a boundary; that is, the interface, between the oxide layer 74a and the oxide layer 74b, across which the electric dipoles 1 are formed. As a result, as illustrated in FIG. 11(b), a position of the band of the oxide layer 74a shifts upwardly with respect to a position of the band of the light-emitting layer 24c of the first wavelength range. Specifically, the ETL conduction band of the oxide layer 74a moves to the ETL conduction band', and the ETL valence band of the oxide layer 74a moves to the ETL valence band'. Because of such moves, an energy difference $\Delta Ec'$ between the lower end of the conduction band of the light-emitting layer 24c of the first wavelength range (a light-emitting layer conduction band) and a lower end of the ETL conduction band' of the oxide layer 74a is smaller than $\Delta Ec$.

In FIG. 11(b), the lower end of the ETL conduction band' of the oxide layer 74a is positioned below the lower end of the conduction band of the light-emitting layer 24c of the first wavelength range (the light-emitting layer conduction band). However, the positioning of the lower ends shall not be limited to such positioning. The lower end of the ETL conduction band' of the oxide layer 74a may be positioned above the lower end of the conduction band of the light-emitting layer 24c of the first wavelength range (the light-emitting layer conduction band).

As illustrated in FIG. 11(b), an electron affinity EA1 of the oxide layer 74a is greater than an electron affinity EA2 of the light-emitting layer 24c of the first wavelength range. An electron affinity EA3 of the oxide layer 74b is smaller than an electron affinity EA2 of the light-emitting layer 24c of the first wavelength range.

Moreover, as illustrated in FIG. 11(b), an energy difference (a bandgap) between the lower end of the conduction band and the upper end of the valence band in the oxide layer 74b is larger than an energy difference (a bandgap) between the lower end of the ETL conduction band' and the upper end of the ETL valence band' in the oxide layer 74a. Hence, the oxide layer 74b is lower in carrier density (a density of electrons) and higher in insulation than the oxide layer 74a. Hence, in the oxide layer 74b, the electrons are transported by tunneling. As can be seen, the density of the electrons in the oxide layer 74a serving as an electron-transport layer is higher than the density of the electrons in the oxide layer 74b. The electrons are injected into the light-emitting layer 24c of the first wavelength range by tunneling through the oxide layer 74b.

In the light-emitting elements 80R and 81R, if the oxide layer 74b is sufficiently thin, the electrons can be transported through the oxide layer 74b by tunneling. Hence, the height of the electron injection barrier between the oxide layer 74a and the light-emitting layer 24c of the first wavelength range is effectively the energy difference $\Delta Ec'$ between the lower end of the valence band of the light-emitting layer 24c of the first wavelength range (the light-emitting layer conduction band) and the lower end of the ETL conduction band' of the oxide layer 74a. Hence, when the oxide layer 74b is formed in the light-emitting elements 80R and 81R, the electrons can be efficiently injected from the oxide layer 74a into the light-emitting layer 24c of the first wavelength range.

The oxide layer 74b preferably has a film thickness of 0.2 nm or more and 5 nm or less. When the film thickness is 5 nm or less, the tunneling of the electrons can be efficiently carried out. Moreover, when the film thickness is 0.2 nm or more, a sufficiently large dipole moment can be obtained. Furthermore, the film thickness is preferably 0.8 nm or more and less than 3 nm. In such a case, the electrons can be injected more efficiently.

As illustrated in FIG. 10(a), if the first electrode 22 is positioned below the light-emitting layer 24c of the first wavelength, and the second electrode 25 is positioned above the light-emitting layer 24c of the first wavelength range, at least the oxide layer 74a of the oxide layers 74a and 74b is preferably a continuous film. As illustrated in FIG. 10(b), if the first electrode 22 is positioned above the light-emitting layer 24c of the first wavelength, and the second electrode 25 is positioned below the light-emitting layer 24c of the first wavelength range, at least the oxide layer 74b of the oxide layers 74a and 74b is preferably a continuous film. That is, either the oxide layer 74a or the oxide layer 74b to be deposited later is preferably at least a continuous film. Here, the continuous film is a highly dense film having a porosity of less than 1%. That is, the continuous film has substantially no voids.

The oxide layers 74a and 74b may be deposited by, for example, sputtering, chemical vapor deposition (CVD), and physical vapor deposition (PVD). The oxide layers 74a and 74b formed by such techniques are continuous films, increasing an area of contact between the oxide layers 74a and 74b and facilitating formation of the electric dipoles 1 with high density. Note that a film formed by application of fine particles such as nano particles is porous because of many voids formed among the fine particles. Such a film cannot be a continuous film.

Note that the density of the oxygen atoms in the oxide layer 74a is higher than or equal to 95% of the density of the oxygen atoms in the oxide layer 74b. In such a case, the oxygen atoms are likely to move, and the electric dipoles 1 are likely to form. More preferably, the density of the oxygen atoms in the oxide layer 74a is higher than or equal to 84% of the density of the oxygen atoms in the oxide layer 74b. In such a case, the electric dipoles 1 are formed more efficiently, making it possible to inject the electrons more efficiently. Still more preferably, the density of the oxygen atoms in the oxide layer 74a is lower than or equal to 80% of the density of the oxygen atoms in the oxide layer 74b, yet still more preferably, lower than or equal to 75%, and yet still more preferably, lower than or equal to 70%. In such a case, the electric dipoles 1 are formed more efficiently, making it possible to inject the electrons more efficiently.

The second oxide layer 74a serving as an electron-transport layer is preferably made of an n-type semiconductor. The second oxide layer 74a serving as an electron-transport layer has a carrier density (a density of the electrons) of preferably $1 \times 10^5$ cm$^{-3}$ or higher. Moreover, the second oxide layer 74a serving as an electron-transport layer has a carrier density (a density of the electrons) of preferably $1 \times 10^{17}$ cm$^{-3}$ or lower.

FIG. 13(a) is a table showing examples of inorganic oxides included in a common electron-transport layer, and densities of the oxygen atoms in the inorganic oxides. FIG. 13(b) is a table showing examples of typical inorganic oxides and densities of the oxygen atoms in the typical inorganic oxides. Note that the inorganic oxides listed in FIG. 13(a) are n-type semiconductors, and the inorganic oxides listed in FIG. 13(b) are insulators.

FIG. 14 is a table showing materials to be selected for the oxide layer (the HTL) 74a from among the examples of the inorganic oxides included in the common electron-transport layer illustrated in FIG. 13(a), and materials to be selected for the oxide layer 74b from among the examples of the typical inorganic oxides listed in FIG. 13(b).

In this embodiment, the density of the oxygen atoms in the oxide layer 74a is lower than the density of the oxygen atoms in the oxide layer 74b. Hence, if the oxide layer 74a is formed of an inorganic oxide containing zinc oxide, the oxide layer 74b can be formed of an inorganic oxide (an oxide of a fifth group) containing at least one of aluminum oxide, gallium oxide, tantalum oxide, zirconium oxide, hafnium oxide, magnesium oxide, germanium oxide, silicon oxide, or a complex oxide containing two or more kinds of cations of these oxides.

If the oxide layer 74a is formed of an inorganic oxide containing titanium oxide, the oxide layer 74b can be formed of an inorganic oxide (an oxide of a first group) containing at least one of aluminum oxide, gallium oxide, or a complex oxide containing two or more kinds of cations of these oxides.

If the oxide layer 74a is formed of an inorganic oxide containing indium oxide, the oxide layer 74b can be formed of an inorganic oxide (an oxide of a fourth group) containing at least one of aluminum oxide, gallium oxide, tantalum oxide, zirconium oxide, hafnium oxide, magnesium oxide, germanium oxide, or a complex oxide containing two or more kinds of cations of these oxides.

If the oxide layer 74a is formed of an inorganic oxide containing tin oxide, the oxide layer 74b can be formed of an inorganic oxide (an oxide of a second group) containing at least one of aluminum oxide, gallium oxide, tantalum oxide, or a complex oxide containing two or more kinds of cations of these oxides.

If the oxide layer 74a is formed of an inorganic oxide containing strontium titanate, the oxide layer 74b can be formed of an inorganic oxide (an oxide of a third group) containing at least one of aluminum oxide, gallium oxide, tantalum oxide, zirconium oxide, hafnium oxide, or a complex oxide containing two or more kinds of cations of these oxides.

The oxide of the first group is made of an inorganic oxide containing at least one of aluminum oxide, gallium oxide, or a complex oxide containing two or more kinds of cations of these oxides. The oxide of the second group is made of an inorganic oxide containing at least one of aluminum oxide, gallium oxide, tantalum oxide, or a complex oxide containing two or more kinds of cations of these oxides. The oxide of the third group is made of an inorganic oxide containing at least one of aluminum oxide, gallium oxide, tantalum oxide, zirconium oxide, hafnium oxide, or a complex oxide containing two or more kinds of cations of these oxides. The oxide of the fourth group is made of an inorganic oxide containing at least one of aluminum oxide, gallium oxide, tantalum oxide, zirconium oxide, hafnium oxide, magnesium oxide, germanium oxide, or a complex oxide containing two or more kinds of cations of these oxides. The oxide of the fifth group is made of an inorganic oxide containing at least one of aluminum oxide, gallium oxide, tantalum oxide, zirconium oxide, hafnium oxide, magnesium oxide, germanium oxide, silicon oxide, or a complex oxide containing two or more kinds of cations of these oxides.

If the oxide layer 74a is made of zinc oxide, the oxide layer 74b is preferably made of at least one of aluminum oxide, gallium oxide, tantalum oxide, zirconium oxide, hafnium oxide, magnesium oxide, germanium oxide, silicon oxide, or a complex oxide containing two or more kinds of cations of these oxides.

If the oxide layer 74a is made of titanium oxide, the oxide layer 74b is preferably made of at least one of aluminum oxide, gallium oxide, or a complex oxide containing two or more kinds of cations of these oxides.

If the oxide layer 74a is made of indium oxide, the oxide layer 74b is preferably made of at least one of aluminum oxide, gallium oxide, tantalum oxide, zirconium oxide, hafnium oxide, magnesium oxide, germanium oxide, or a complex oxide containing two or more kinds of cations of these oxides.

If the oxide layer 74a is made of tin oxide, the oxide layer 74b is preferably made of at least one of aluminum oxide, gallium oxide, tantalum oxide, or a complex oxide containing two or more kinds of cations of these oxides.

If the oxide layer 74a is made of strontium titanate, the oxide layer 74b is preferably made of at least one of aluminum oxide, gallium oxide, tantalum oxide, zirconium oxide, hafnium oxide, or a complex oxide containing two or more kinds of cations of these oxides.

Note that each of tin oxide (e.g. $SnO_2$) and indium oxide (e.g. $In_2O_3$) has a lower end of a conduction band positioned deep, and is not usually used as an electron-transport layer (the ETL). However, when the electric dipoles 1 are formed using the oxide layer 74b, tin oxide and indium oxide can be used as an electron-transport layer (an ETL).

The oxide layer 74a may be an oxide containing any one or more of elements Zn, In, Sn, and Ti as main components.

Moreover, the oxide layer 74a may be an oxide containing any one of elements Zn, In, Sn, or Ti with the highest content other than oxygen.

The oxide layer 74b may be an oxide containing any one or more of elements Al, Ga, Ta, Zr, Hf, Mg, Ge, and Si as main components.

Moreover, the oxide layer 74b may be an oxide containing any one of elements Al, Ga, Ta, Zr, Hf, Mg, Ge, or Si with the highest content other than oxygen.

As can be see, the oxide layers 74a and 74b may be made of a complex oxide containing two or more kinds of cations of the oxides.

Moreover, the oxide layer 74b may contain cations contained in the oxide layer 74a. In such a case, lattice mismatch between the oxide layers 74a and 74b is reduced, making it possible to effectively achieve advantageous effects of the electric dipoles 1.

Note that the combinations of the oxide layers 74a and 74b shall not be limited to the above combinations as long as the density of the oxygen atoms in the oxide layer 74a is lower than the density of the oxygen atoms in the oxide layer 74b.

Note that an inorganic oxide forming the oxide layers 74a and 74b is preferably in the form of a substance other than particles in view of increasing an area of contact between the oxide layers 74a and 74b. If the organic oxide is in the form of particles, preferably, one of the oxide layers 74a and 74b made of particles is a lower layer, and the other oxide layer 74a or 74b made of a substance other than particles is provided on the oxide layer made of particles. That is, preferably, the oxide layer made of particles is formed before, and the other oxide layer made of a substance other than particles is formed later. In other words, either the oxide layer 74a or the oxide layer 74b whichever formed farther away at least from the substrate 10 (see FIG. 1) is preferably a continuous film. Here, the continuous film is a highly dense film having a porosity of less than 1%. That is, the continuous film has substantially no voids.

As can be seen, in the light-emitting elements 80R and 81R, the density of the oxygen atoms in the oxide layer 74a is lower than the density of the oxygen atoms in the oxide layer 74b. Such a feature makes it possible to achieve efficient electron injection and high light emission efficiency.

Sixth Embodiment

Figure 15:
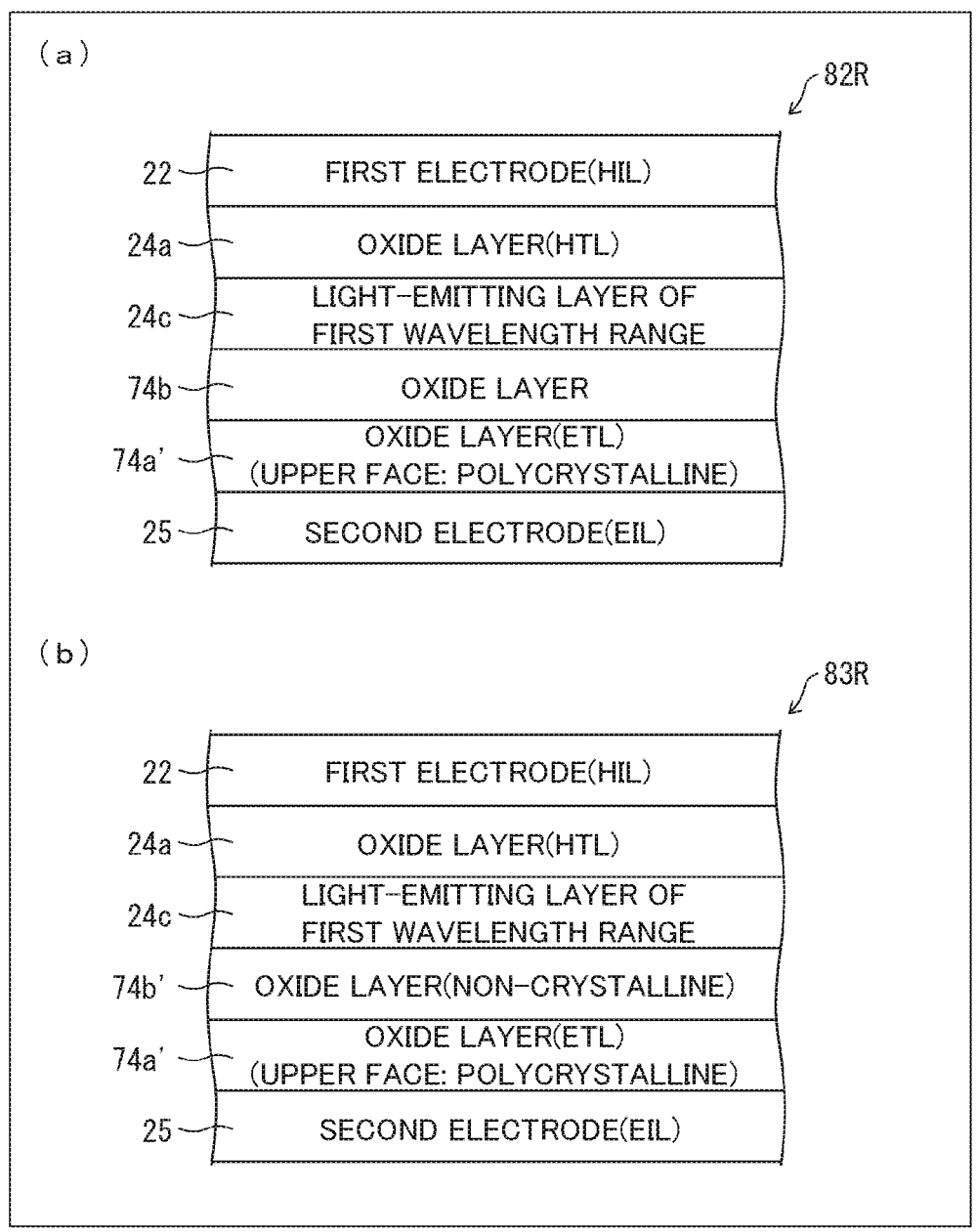
FIG. 15(a) illustrates a schematic configuration of a light-emitting element according to a sixth embodiment.
FIG. 15(b) illustrates a schematic configuration of another light-emitting element according to the sixth embodiment.

Next, with reference to FIG. 15, a sixth embodiment of disclosure is described. The sixth embodiment is different from the fifth embodiment in that: (i) in a light-emitting element 82R according to the sixth embodiment, an upper face of an oxide layer (the second oxide layer) 74a' in contact with the oxide layer (the first oxide layer) 74b contains grains; and (ii) in a light-emitting element 83R according to the sixth embodiment, an oxide layer (the first oxide layer) 74b' is amorphous, and an upper face of the oxide layer (the second oxide layer) 74a' in contact with the oxide layer 74b' contains grains. That is, the oxide layers 74a' and 74b' respectively correspond to the oxide layers 74a and 74b according to the fifth embodiment, and can be made of the same materials as the materials of the oxide layers 74a and 74b according to the fifth embodiment. Note that, for the sake of description, the same reference signs are used to denote components having the same functions as the functions of the components illustrated in the drawings in the fifth embodiment. Description of such components will be omitted.

FIG. 15(a) illustrates a schematic configuration of the light-emitting element 82R according to the sixth embodiment. FIG. 15(b) illustrates a schematic configuration of the light-emitting element 83R according to the sixth embodiment.

In the light-emitting element 82R illustrated in FIG. 15(a), the first electrode 22 is positioned above the light-emitting layer 24c of the first wavelength range. The second electrode 25 is positioned below the light-emitting layer 24c of the first wavelength range. A portion of at least the upper face of the oxide layer 74a' in contact with the oxide layer 74b is polycrystalline. That is, the upper face of the oxide layer 74a' contains grains. The grains contained in the upper face of the oxide layer 74a' increase an area of an interface between the upper face of the oxide layer 74a' and the oxide layer 74b. Such a feature makes it possible to form electric dipoles more efficiently. Hence, in the light-emitting element 82R, the electrons can be injected efficiently.

In the light-emitting element 82R illustrated in FIG. 15(b), the first electrode 22 is positioned above the light-emitting layer 24c of the first wavelength range. The second electrode 25 is positioned below the light-emitting layer 24c of the first wavelength range. A portion of at least the upper face of the oxide layer 74a' in contact with the oxide layer 74b' is polycrystalline. The oxide layer 74b' is made of an amorphous oxide. That is, the upper face of the oxide layer 74a' contains grains.

The amorphous oxide contained in the oxide layer 74b' can provide excellent coverage on the oxide layer 74a' having grains. Such a feature facilitates formation of the electric dipoles 1. Moreover, the amorphous oxide of the oxide layer 74b' allows the oxide layer 74b' to have greater uniformity in film thickness. Such a feature makes it possible to transport the electrons more uniformly in the oxide layer 74b'. The grains contained in the upper face of the oxide layer 74a' increase an area of an interface between the upper face of the oxide layer 74a' and the oxide layer 74b'. Such a feature makes it possible to form electric dipoles more efficiently. Hence, in the light-emitting element 83R, the electrons can be injected efficiently.

Note that, in this embodiment, a laser beam is used to thermally treat a portion including the upper face of the oxide layer 74a' in order to polycrystallize the upper face of the oxide layer 74a'. However, the technique of the polycrystallization shall not be limited to such a technique. The technique to polycrystallize the oxide layer 74a' and the kind of a polycrystalline oxide contained in the oxide layer 74a' shall not be limited to a particular technique and a particular kind, as long as the density of the oxygen atoms in the oxide layer (the ETL) 74a' is lower than the density of the oxygen atoms in the oxide layer 74b, or the density of the oxygen atoms in the oxide layer 74b'.

In this embodiment, described as an example is, but not limited to, a case where the upper face of the oxide layer 74a' is polycrystallized to have grains. Alternatively, for example, a technique such as sputtering and the CVD may be used to take advantage of voluntary growth of the nuclei to form grains in a portion of at least the upper face of the oxide layer 74a'.

In this embodiment, described as an example is, but not limited to, a case where the upper face of the oxide layer 74a' is polycrystallized. Alternatively, the oxide layer 74a' may entirely be made of a polycrystalline oxide.

In this embodiment, described as an example is, but not limited to, a case where the upper face of the oxide layer 74a' contains grains. Alternatively, the oxide layer 74a' may entirely contain grains.

Note that, in the upper face of the oxide layer 74a', the grains may discretely be distributed. Moreover, the grains may be crystal grains containing crystals or amorphous phases.

Other than the above features, the sixth embodiment is the same as the fifth embodiment. Hence, the sixth embodiment will not be elaborated upon any further here.

Seventh Embodiment

Figure 16:
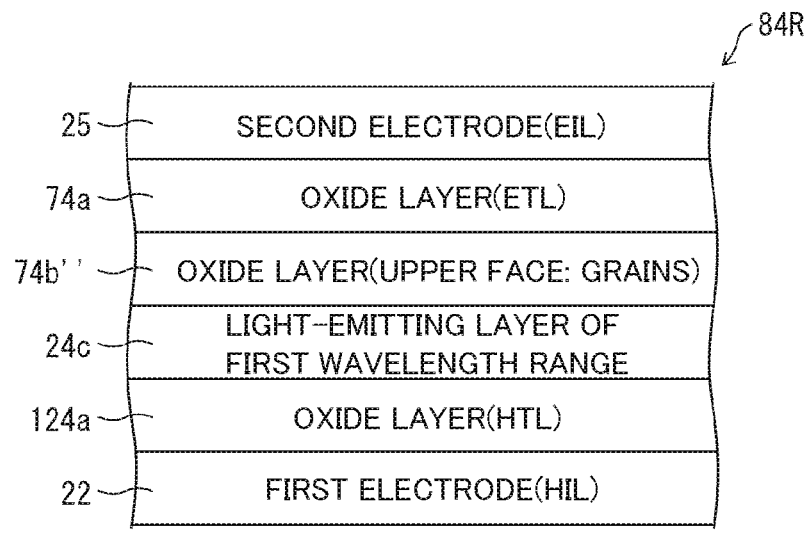
FIG. 16 illustrates a schematic configuration of a light-emitting element according to a seventh embodiment.

Next, with reference to FIG. 16, a seventh embodiment of disclosure is described. The seventh embodiment is different from the fifth and sixth embodiments in that, in a light-emitting element 84R according to the seventh embodiment, at least an upper face of an oxide layer (the first oxide layer) 74b" in contact with the oxide layer (the ETL, the second oxide layer) 74a contains grains. That is, the oxide layer 74b" corresponds to the oxide layers 74b and 74b' according to the fifth and sixth embodiments, and can be made of the same material as the materials of the oxide layers 74b and 74b'. Note that, for the sake of description, the same reference signs are used to denote components having the same functions as the functions of the components illustrated in the drawings in the fifth and sixth embodiments. Description of such components will be omitted.

FIG. 16 illustrates a schematic configuration of the light-emitting element 84R according to the seventh embodiment.

In the light-emitting element 84R illustrated in FIG. 16, the first electrode 22 is positioned below the light-emitting layer 24c of the first wavelength range. The second electrode 25 is positioned above the light-emitting layer 24c of the first wavelength range. At least an upper face of the oxide layer 74b" in contact with the oxide layer (the ETL) 74a contains grains. In the oxide layer 74b", the grains may discretely be distributed. Moreover, the grains may be crystal grains containing crystals or amorphous phases.

In this embodiment, described as an example is, but not limited to, a case where the upper face of the oxide layer 74b" in contact with the oxide layer 74a contains grains. Alternatively, the oxide layer 74b" may entirely contain grains.

Note that, in this embodiment, a laser beam is used to thermally treat a portion including the upper face of the oxide layer 74b" so that the upper face of the oxide layer 74b" contains grains. However, the technique of forming grains shall not be limited to such a technique. For example, a technique such as sputtering and the CVD may be used to take advantage of voluntary growth of the nuclei to form the grains. The technique to form the oxide layer 74b" to contain grains and the kind of the oxide layer 74b" shall not be limited to a particular technique and a particular kind, as long as the density of the oxygen atoms in the oxide layers 74a is lower than the density of the oxygen atoms in the oxide layer 74b".

As can be seen, the grains contained in the upper face of the oxide layer 74b" in contact with the oxide layer 74a increase an area of an interface between the oxide layer 74a and the upper face of the oxide layer 74b". Such a feature makes it possible to form electric dipoles more efficiently. Hence, in the light-emitting element 84R, the electrons can be injected efficiently.

The oxide layer 74a may be made of an amorphous oxide. The amorphous oxide contained in the oxide layer 74a can provide excellent coverage on the oxide layer 74b" having grains. Such a feature facilitates formation of the electric dipoles 1. Moreover, the amorphous oxide of the oxide layer 74a allows the oxide layer 74a to have greater uniformity in film thickness. Such a feature makes it possible to transport the electrons more uniformly in the oxide layer 74a. Even if the oxide layer 74a is made of an amorphous oxide, the upper face of the oxide layer 74b'' contains grain. The grains increase an area of the interface between the oxide layers 74a and 74b'', making it possible to form the electric dipoles 1 more efficiently. Even in such a case, in the light-emitting element 84R, the electrons can be efficiently injected from the oxide layer 74a into the light-emitting layer 24c of the first wavelength range.

Other than the above features, the seventh embodiment is the same as the fifth and sixth embodiments. Hence, the seventh embodiment will not be elaborated upon any further here.

Eighth Embodiment

Figure 17:
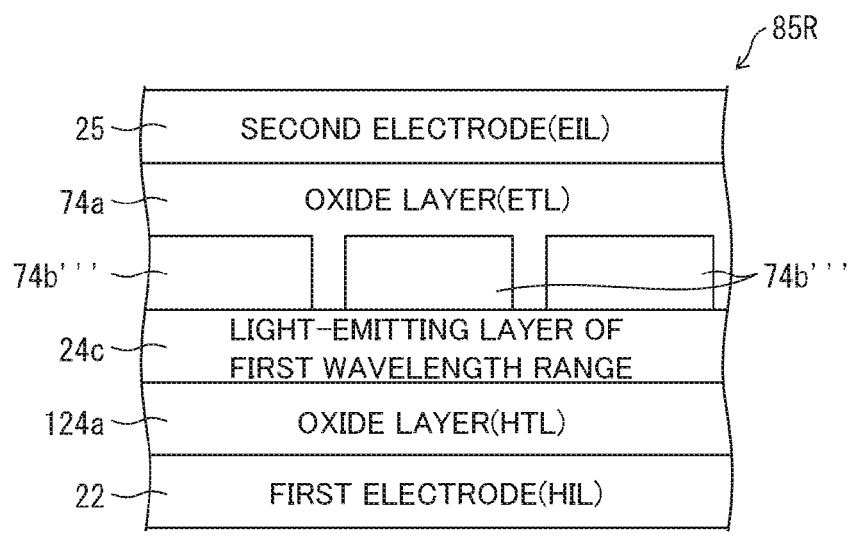
FIG. 17 illustrates a schematic configuration of a light-emitting element according to an eighth embodiment.

Next, with reference to FIG. 17, an eighth embodiment of disclosure is described. The eighth embodiment is different from the fifth to seventh embodiments in that a light-emitting element 85R according to the eighth embodiment includes a plurality of oxide layers (first oxide layers) 74b''' shaped into islands and formed in contact with the oxide layer (the ETL: the second oxide layer) 74a. That is, the oxide layers 74b''' correspond to the oxide layers 74b, 74b', and 74'' according to the fifth to seventh embodiments, and is made of the same material as the materials of the oxide layers 74b, 74b', and 74''. Note that, for the sake of description, the same reference signs are used to denote components having the same functions as the functions of the components illustrated in the drawings in the fifth to seventh embodiments. Description of such components will be omitted.

FIG. 17 illustrates a schematic configuration of the light-emitting element 85R according to the eighth embodiment.

In the light-emitting element 85R illustrated in FIG. 17, the first electrode 22 is positioned below the light-emitting layer 24c of the first wavelength range. The second electrode 25 is positioned above the light-emitting layer 24c of the first wavelength range. The oxide layers 74b'' in contact with the oxide layer 74a are shaped into islands. The oxide layers 74b''' can be shaped into islands by voluntary growth of the nuclei, using techniques such as sputtering and the CVD. Moreover, a thin film may be formed, and, after that, the thin film may be processed to be shaped into islands by, for example, etching. Furthermore, when the oxide layers 74b''' are patterned to be shaped into islands, the patterning step may be carried out to increase surface roughness of the oxide layers 74b'''.

The density of the oxygen atoms in the oxide layers 74a is lower than a density of oxygen atoms in the oxide layers 74b'''. The oxide layers 74b''' are shaped into a plurality of islands, increasing an area of an interface between the oxide layers 74b''' and the oxide layer 74a. Such a feature makes it possible to form electric dipoles more efficiently. Hence, in the light-emitting element 85R, the electrons can be injected efficiently.

The oxide layer 74a may be made of an amorphous oxide. The amorphous oxide contained in the oxide layer 74a can provide excellent coverage on the oxide layers 74b''' shaped into islands. Such a feature facilitates formation of the electric dipoles 1. Moreover, the amorphous oxide of the oxide layer 74a allows the oxide layer 74a to have greater uniformity in film thickness. Such a feature makes it possible to transport the electrons more uniformly in the oxide layer 74a. Even if the oxide layer 74a is made of an amorphous oxide, the oxide layers 74b''' are shaped into a plurality of islands. The oxide layers 74b''' increase an area of the interface between the oxide layers 74a and 74b'''. Hence, in the light-emitting element 85R, the electrons can be efficiently injected from the oxide layer 74a into the light-emitting layer 24c of the first wavelength range.

Other than the above features, the eighth embodiment is the same as the fifth to seventh embodiments. Hence, the eighth embodiment will not be elaborated upon any further here.

Ninth Embodiment

Figure 18:
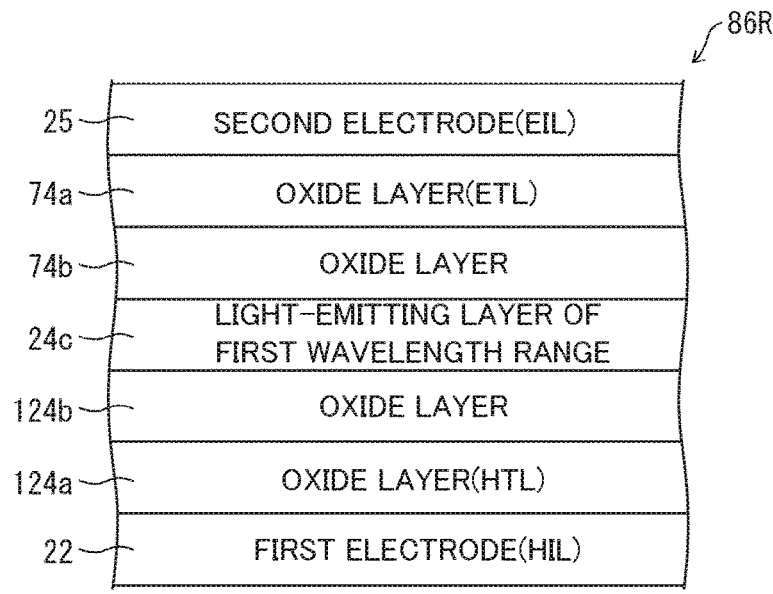
FIG. 18 illustrates a schematic configuration of a light-emitting element according to a ninth embodiment.
Figure 19:
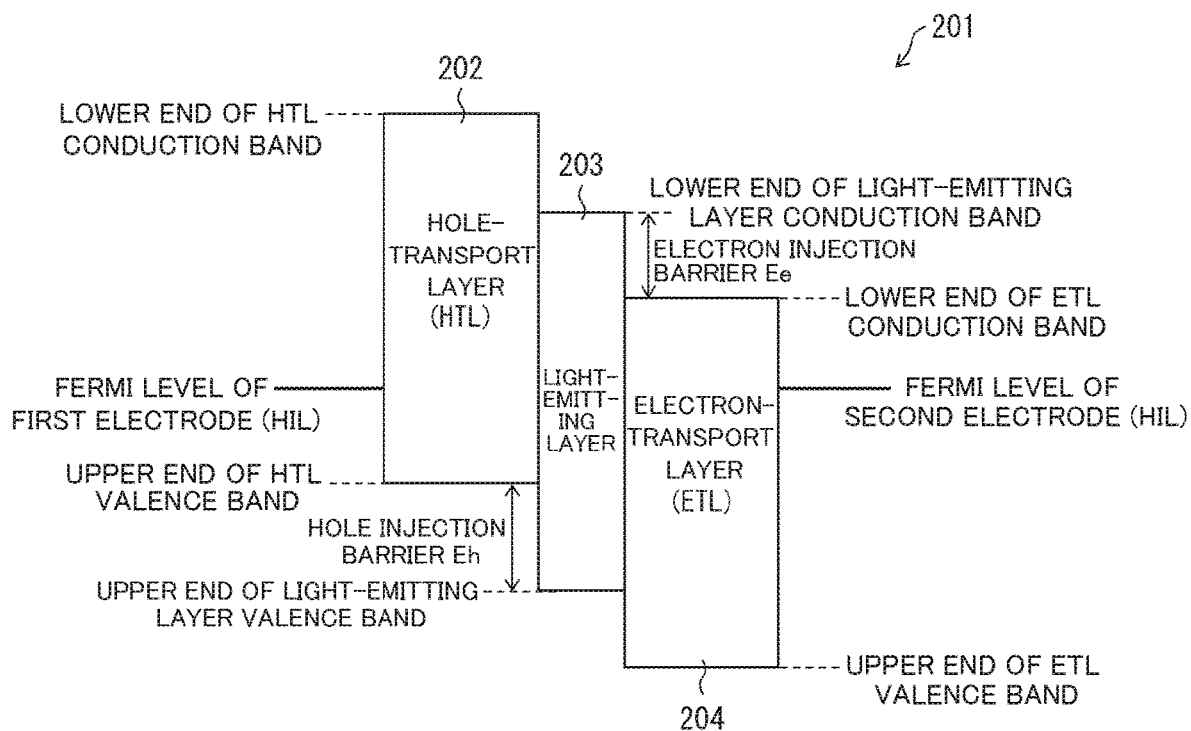
FIG. 19 is an energy band diagram showing a reason why it is difficult to see injection of holes and electrons in a known light-emitting element.

Next, with reference to FIG. 18, a ninth embodiment of disclosure is described. The ninth embodiment is different from the first to eighth embodiments in that a light-emitting element 86R according to the ninth embodiment includes: (i) the oxide layer (an HTL, namely, the first oxide layer) 124a serving as a hole-transport layer and the oxide layer (the second oxide layer) 124b both provided between the first electrode 22 and the light-emitting layer 24c of the first wavelength range, and sequentially stacked one another from toward the first electrode 22; and (ii) the oxide layer (an ETL, namely, a fourth oxide layer) 74a serving as an electron-transport layer and the oxide layer (a third oxide layer) 74b both provided between the second electrode 25 and the light-emitting layer 24c of the first wavelength range, and sequentially stacked one another from toward the second electrode 25. Note that, for the sake of description, the same reference signs are used to denote components having the same functions as the functions of the components illustrated in the drawings in the first to eighth embodiments. Description of such components will be omitted.

FIG. 18 illustrates a schematic configuration of the light-emitting element 86R according to the ninth embodiment.

As illustrated in FIG. 18, the light-emitting element 86R includes the oxide layer (the HTL) 124a serving as a hole-transport layer and the oxide layer 124b. The oxide layers 124a and 124b are provided between the first electrode 22 and the light-emitting layer 24c of the first wavelength range, and stacked one another from toward the first electrode 22. The light-emitting element 86R also includes the oxide layer (the ETL) 74a serving as an electron-transport layer and the oxide layer 74b. The oxide layers 74a and 74b are provided between the second electrode 25 and the light-emitting layer 24c of the first wavelength range, and stacked one another from toward the second electrode 25.

As the oxide layer (the HTL) 124a and the oxide layer 124b according to this embodiment, the oxide layer (the HTL) 124a and the oxide layer 124b according to the first to fourth embodiments are applicable.

Moreover, as the oxide layer (the ETL) 74a and the oxide layer 74b according to this embodiment, the oxide layer (the ETL) 74a and the oxide layer 74b according to the fifth to eighth embodiments are applicable.

A density of oxygen atoms in the oxide layer 124b is lower than a density of oxygen atoms in the oxide layer (the HTL) 124a, and a density of oxygen atoms in the oxide layer (the ETL) 74a is lower than a density of oxygen atoms in the oxide layer 74b. Such features make it possible to inject the holes and the electrons into the light-emitting layer 24c of the first wavelength range, and to achieve high light emission efficiency.

In this embodiment, described as an example is, but not limited to, the light-emitting element including the oxide layer (the HTL) 124a, the oxide layer 124b, the oxide layer 74b, and the oxide layer (the ETL) 74a. Alternatively, as seen in the first to eighth embodiments, the light-emitting element may include two oxide layers between the light-emitting layer 24c of the first wavelength range and either the first electrode 22 or the second electrode 25, and the two oxide layers may have different densities of oxide atoms and have contact with each other.

Note that a density of oxygen atoms in an oxide layer according to the present disclosure is a density of oxygen atoms of a bulk of a material included in the oxide layer, as a unique value that the oxide layer has. For example, to the materials listed in FIGS. 5 and 13, the densities of the oxygen atoms listed in FIGS. 5 and 13 are applied. Note that a density of oxygen atoms in a complex oxide can be obtained as follows: For all the cations contained in the complex oxide, a density of the oxygen atoms included in an oxide of each cation alone is multiplied by a composition rate of each of the cations with respect to all the cations included in the complex oxide, and obtained products are added up. Then, a weighted average of the sum is calculated so that the density of the oxygen atoms in the complex oxide can be obtained.

That is, as to a complex oxide containing N kinds of cations Ai (i=1, 2, 3, . . . , N), where Xi is a percentage of number densities of cations Ai with respect to the sum of the number densities of all the cations (a composition rate of each of the cations with respect to all the cations included in the complex oxide), and Di is a density of oxide atoms of an oxide containing cations Ai alone as cations (an oxide containing cations Ai only), a density of oxide atoms MDi in the complex oxide is expressed using Expression A below. Note that the sum of Xi (i=1, 2, 3, . . . , N) is 1 as expressed using Expression B below.

[Math. 1]
$$MDi = \sum_{i=1}^{N} Xi \cdot Di \quad \text{(Expression 1)}$$

[Math. 2]
$$\sum_{i=1}^{N} Xi = 1 \quad \text{(Expression 2)}$$

Summary

First Aspect

A light-emitting element includes: a first electrode serving as an anode;
a second electrode serving as a cathode;
a light-emitting layer provided between the first electrode and the second electrode;
a first oxide layer provided between the light-emitting layer and either the first electrode or the second electrode; and
a second oxide layer provided between the first oxide layer and the second electrode, and having contact with the first oxide layer.
Either the first oxide layer or the second oxide layer whichever farther away from the light-emitting layer is made of a semiconductor.
A density of oxygen atoms in the second oxide layer is lower than a density of oxygen atoms in the first oxide layer.

Second Aspect

In the light-emitting element according to the first aspect, the second oxide layer is made of an inorganic oxide.

Third Aspect

In the light-emitting element according to the first aspect or the second aspect, the second oxide layer is made of an inorganic oxide.

Fourth Aspect

In the light-emitting element according to any one of the first to third aspects, either the first oxide layer or the second oxide layer whichever closer to the light-emitting layer is made of an insulator.

Fifth Aspect

The light-emitting element according to any one of the first to fourth aspects further includes electric dipoles formed across an interface between the first oxide layer and the second oxide layer.

Sixth Aspect

In the light-emitting element according to the fifth aspect, the electric dipoles include a dipole moment oriented from the second oxide layer toward the first oxide layer.

Seventh Aspect

In the light-emitting element according to any one of the first to sixth aspects, the first electrode, the second electrode, the light-emitting layer, the first oxide layer, and the second oxide layer are provided above a face of a substrate.
At least one of the first oxide layer or the second oxide layer whichever positioned above and provided farther away from the substrate is a continuous film.

Eighth Aspect

In the light-emitting element according to any one of the first to seventh aspects, the first electrode, the second electrode, the light-emitting layer, the first oxide layer, and the second oxide layer are provided above a face of a substrate.
The first electrode is positioned closer to the substrate than the second electrode is, and provided below the light-emitting layer.
The second electrode is positioned farther away from the substrate than the first electrode is, and provided above the light-emitting layer.
The second oxide layer has a porosity of less than 1%.

Ninth Aspect

In the light-emitting element according to any one of the first to seventh aspects, the first electrode, the second electrode, the light-emitting layer, the first oxide layer, and the second oxide layer are provided above a face of a substrate.
The first electrode is positioned farther away from the substrate than the second electrode is, and provided above the light-emitting layer.

The second electrode is positioned closer to the substrate than the first electrode is, and provided below the light-emitting layer.

At least the first oxide layer of the first oxide layer and the second oxide layer is a continuous film.

Tenth Aspect

In the light-emitting element according to any one of the first to seventh and ninth aspects, the first electrode, the second electrode, the light-emitting layer, the first oxide layer, and the second oxide layer are provided above a face of a substrate.

The first electrode is positioned farther away from the substrate than the second electrode is, and provided above the light-emitting layer.

The second electrode is positioned closer to the substrate than the first electrode is, and provided below the light-emitting layer.

The first oxide layer has a porosity of less than 1%.

Eleventh Aspect

In the light-emitting element according to any one of the first to tenth aspects, the first electrode, the second electrode, the light-emitting layer, the first oxide layer, and the second oxide layer are provided above a face of a substrate.

At least an upper face of either the first oxide layer or the second oxide layer whichever positioned below and provided closer to the substrate contains grains.

Twelfth Aspect

In the light-emitting element according to any one of the first to tenth aspects, the first electrode, the second electrode, the light-emitting layer, the first oxide layer, and the second oxide layer are provided above a face of a substrate.

A portion of at least an upper face of either the first oxide layer or the second oxide layer whichever positioned below and provided closer to the substrate is polycrystalline.

Thirteenth Aspect

In the light-emitting element according to any one of the first to sixth aspects, the first electrode, the second electrode, the light-emitting layer, the first oxide layer, and the second oxide layer are provided above a face of a substrate.

Either the first oxide layer or the second oxide layer whichever positioned below and provided closer to the substrate is shaped into a plurality of islands.

Fourteenth Aspect

In the light-emitting element according to any one of the first to thirteenth aspects, the first electrode, the second electrode, the light-emitting layer, the first oxide layer, and the second oxide layer are provided above a face of a substrate.

Either the first oxide layer or the second oxide layer whichever positioned above and provided farther away from the substrate is made of an amorphous oxide.

Fifteenth Aspect

In the light-emitting element according to any one of the first to seventh, ninth, tenth, and thirteenth aspects, the first electrode, the second electrode, the light-emitting layer, the first oxide layer, and the second oxide layer are provided above a face of a substrate.

The first electrode is positioned farther away from the substrate than the second electrode is, and provided above the light-emitting layer.

The second electrode is positioned closer to the substrate than the first electrode is, and provided below the light-emitting layer.

At least an upper face of the second oxide layer contains grains.

Sixteenth Aspect

In the light-emitting element according to any one of the first to seventh, ninth, tenth, and thirteenth aspects, the first electrode, the second electrode, the light-emitting layer, the first oxide layer, and the second oxide layer are provided above a face of a substrate.

The first electrode is positioned farther away from the substrate than the second electrode is, and provided above the light-emitting layer.

The second electrode is positioned closer to the substrate than the first electrode is, and provided below the light-emitting layer.

A portion of at least an upper face of the second oxide layer is polycrystalline.

Seventeenth Aspect

In the light-emitting element according to any one of the first to sixth aspects, the first electrode, the second electrode, the light-emitting layer, the first oxide layer, and the second oxide layer are provided above a face of a substrate.

The first electrode is positioned farther away from the substrate than the second electrode is, and provided above the light-emitting layer.

The second electrode is positioned closer to the substrate than the first electrode is, and provided below the light-emitting layer.

The second oxide layer is shaped into a plurality of islands.

Eighteenth Aspect

In the light-emitting element according to any one of the ninth, tenth, and fifteenth to seventeenth aspects, the first oxide layer is made of an amorphous oxide.

Nineteenth Aspect

In the light-emitting element according to any one of the first to eleventh aspects, the first electrode layer and the second electrode layer are provided between the first electrode and the light-emitting layer, and the first oxide layer is made of a p-type semiconductor.

Twentieth Aspect

In the light-emitting element according to the nineteenth aspect, the first oxide layer contains at least one of nickel oxide or copper-aluminum oxide.

Twenty First Aspect

In the light-emitting element according to the nineteenth aspect or the twentieth aspect, the second oxide layer contains at least one of strontium oxide, lanthanum oxide, yttrium oxide, silicon oxide, germanium oxide, or a complex oxide containing two or more kinds of cations of the strontium oxide, the lanthanum oxide, the yttrium oxide, the silicon oxide, and the germanium oxide.

Twenty Second Aspect

In the light-emitting element according to the nineteenth aspect or the twentieth aspect, the second oxide layer contains at least one of strontium oxide, lanthanum oxide, yttrium oxide, silicon oxide, germanium oxide, or a complex oxide containing two or more kinds of cations of the strontium oxide, the lanthanum oxide, the yttrium oxide, the silicon oxide, and the germanium oxide.

Twenty Third Aspect

In the light-emitting element according to the nineteenth aspect or the twentieth aspect, the second oxide layer is made of an oxide containing any one or more of elements Sr, La, Y, Si, and Ge as main components.

Twenty Fourth Aspect

In the light-emitting element according to the nineteenth aspect or the twentieth aspect, the second oxide layer is made of an oxide containing any one of elements Zn, In, Sn, or Ti with a highest content other than oxygen.

Twenty Fifth Aspect

A light-emitting element includes: a first electrode serving as an anode;
a second electrode serving as a cathode;
a light-emitting layer provided between the first electrode and the second electrode;
a first oxide layer provided between the first electrode and the light-emitting layer; and
a second oxide layer provided between the first oxide layer and the light-emitting layer, and having contact with the first oxide layer.
The first oxide layer contains at least one of nickel oxide or copper-aluminum oxide.
The second oxide layer contains at least one of strontium oxide, lanthanum oxide, yttrium oxide, silicon oxide, germanium oxide, or a complex oxide containing two or more kinds of cations of the strontium oxide, the lanthanum oxide, the yttrium oxide, the silicon oxide, and the germanium oxide.

Twenty Sixth Aspect

In the light-emitting element according to any one of the nineteenth to twenty fifth aspects, an energy difference between a lower end of a conduction band and an upper end of a valence band in the second oxide layer is larger than an energy difference between a lower end of a conduction band and an upper end of a valence band in the first oxide layer.

Twenty Seventh Aspect

In the light-emitting element according to any one of the nineteenth to twenty sixth aspects, a density of holes in the first oxide layer is higher than a density of holes in the second oxide layer.

Twenty Eighth Aspect

In the light-emitting element according to any one of the nineteenth twenty seventh aspects, an ionization potential of the first oxide layer is smaller than an ionization potential of the light-emitting layer.
An ionization potential of the second oxide layer is larger than an ionization potential of the light-emitting layer.

Twenty Ninth Aspect

In the light-emitting element according to any one of the nineteenth to twenty eighth aspects, the second oxide layer has a film thickness of 0.2 nm or more and 5 nm or less.

Thirtieth Aspect

In the light-emitting element according to twenty ninth aspect, the second oxide layer has a film thickness of 0.8 nm or more and 3 nm or less.

Thirty First Aspect

In the light-emitting element according to any one of the nineteenth to thirtieth aspects, the density of the oxygen atoms in the second oxide layer is higher than or equal to 50%, and lower than or equal to 90%, of the density of the oxygen atoms in the first oxide layer.

Thirty Second Aspect

In the light-emitting element according to thirty first aspect, the density of the oxygen atoms in the second oxide layer is higher than or equal to 50%, and lower than or equal to 80%, of the density of the oxygen atoms in the first oxide layer.

Thirty Third Aspect

In the light-emitting element according to any one of the nineteenth to thirty second aspects, the density of the oxygen atoms in the second oxide layer is higher than or equal to 50% of the density of the oxygen atoms in the first oxide layer.

Thirty Fourth Aspect

In the light-emitting element according to any one of the first to eleventh aspects, the first electrode layer and the second electrode layer are provided between the light-emitting layer and the second electrode.
The second oxide layer is made of an n-type semiconductor.

Thirty Fifth Aspect

In the light-emitting element according to the thirty fourth aspect, the second oxide layer contains any one of zinc oxide, indium oxide, tin oxide, titanium oxide, or strontium titanate.

Thirty Sixth Aspect

In the light-emitting element according to the thirty fourth aspect, the second oxide layer is made of an oxide containing any one or more of elements Zn, In, Sn, and Ti as main components.

Thirty Seventh Aspect

In the light-emitting element according to the thirty fourth aspect, the second oxide layer is made of an oxide containing any one of elements Zn, In, Sn, or Ti with a highest content other than oxygen.

Thirty Eighth Aspect

In the light-emitting element according to any one of the thirty third to thirty seventh aspects, the first oxide layer contains at least one of aluminum oxide, gallium oxide, tantalum oxide, zirconium oxide, hafnium oxide, magnesium oxide, germanium oxide, silicon oxide, or a complex oxide containing two or more kinds of cations of the aluminum oxide, the gallium oxide, the tantalum oxide, the zirconium oxide, the hafnium oxide, the magnesium oxide, the germanium oxide, and the silicon oxide.

Thirty Ninth Aspect

In the light-emitting element according to any one of the thirty third to thirty seventh aspects, the first oxide layer contains at least one of aluminum oxide, gallium oxide, tantalum oxide, zirconium oxide, hafnium oxide, magnesium oxide, germanium oxide, silicon oxide, or a complex oxide containing two or more kinds of cations of the aluminum oxide, the gallium oxide, the tantalum oxide, the zirconium oxide, the hafnium oxide, the magnesium oxide, the germanium oxide, and the silicon oxide.

Fortieth Aspect

In the light-emitting element according to any one of the thirty third to thirty seventh aspects, the first oxide layer is made of an oxide containing any one or more of elements Al, Ga, Ta, Zr, Hf, Mg, Ge, and Si as main components.

Forty First Aspect

In the light-emitting element according to any one of the thirty third to thirty seventh aspects, the first oxide layer is made of an oxide containing any one of elements Al, Ga, Ta, Zr, Hf, Mg, Ge, or Si with a highest content other than oxygen.

Forty Second Aspect

A light-emitting element includes: a first electrode serving as an anode;
a second electrode serving as a cathode;
a light-emitting layer provided between the first electrode and the second electrode;
a first oxide layer provided between the second electrode and the light-emitting layer; and
a second oxide layer provided between the first oxide layer and the second electrode, and having contact with the first oxide layer.

An oxide containing at least one of aluminum oxide, gallium oxide, or a complex oxide containing two or more kinds of cations of the aluminum oxide and the gallium oxide is of a first group.

An oxide containing at least one of aluminum oxide, gallium oxide, tantalum oxide, or a complex oxide containing two or more kinds of cations of the aluminum oxide, the gallium oxide, and the tantalum oxide is of a second group.

An oxide containing at least one of aluminum oxide, gallium oxide, tantalum oxide, zirconium oxide, hafnium oxide, or a complex oxide containing two or more kinds of cations of the aluminum oxide, the gallium oxide, the tantalum oxide, the zirconium oxide, and the hafnium oxide is of a third group.

An oxide containing at least one of aluminum oxide, gallium oxide, tantalum oxide, zirconium oxide, hafnium oxide, magnesium oxide, germanium oxide, or a complex oxide containing two or more kinds of cations of the aluminum oxide, the gallium oxide, the tantalum oxide, the zirconium oxide, the hafnium oxide, the magnesium oxide, and the germanium oxide is of a fourth group.

An oxide containing at least one of aluminum oxide, gallium oxide, tantalum oxide, zirconium oxide, hafnium oxide, magnesium oxide, germanium oxide, silicon oxide, or a complex oxide containing two or more kinds of cations of the aluminum oxide, the gallium oxide, the tantalum oxide, the zirconium oxide, the hafnium oxide, the magnesium oxide, the germanium oxide, and the silicon oxide is of a fifth group.

If the second oxide layer contains titanium oxide, the first oxide layer is the oxide of the first group.

If the second oxide layer contains tin oxide, the first oxide layer is the oxide of the second group.

If the second oxide layer contains strontium titanate, the first oxide layer is the oxide of the third group.

If the second oxide layer contains indium oxide, the first oxide layer is the oxide of the fourth group.

If the second oxide layer contains zinc oxide, the first oxide layer is the oxide of the fifth group.

Forty Third Aspect

In the light-emitting element according to the fourth second aspect, the second oxide layer is made of zinc oxide.

The first oxide layer is made of at least one of aluminum oxide, gallium oxide, tantalum oxide, zirconium oxide, hafnium oxide, magnesium oxide, germanium oxide, silicon oxide, or a complex oxide containing two or more kinds of cations of the aluminum oxide, the gallium oxide, the tantalum oxide, the zirconium oxide, the hafnium oxide, the magnesium oxide, the germanium oxide, and the silicon oxide.

Forty Fourth Aspect

In the light-emitting element according to the fourth second aspect, the second oxide layer is made of titanium oxide.

The first oxide layer is made of at least one of aluminum oxide, gallium oxide, and a complex oxide containing two or more kinds of cations of the aluminum oxide and the gallium oxide.

Forty Fifth Aspect

In the light-emitting element according to the fourth second aspect, the second oxide layer is made of indium oxide.

The first oxide layer is made of at least one of aluminum oxide, gallium oxide, tantalum oxide, zirconium oxide, hafnium oxide, magnesium oxide, germanium oxide or a complex oxide containing two or more kinds of cations of the aluminum oxide, the gallium oxide, the tantalum oxide, the zirconium oxide, the hafnium oxide, the magnesium oxide, and the germanium oxide.

Forty Sixth Aspect

In the light-emitting element according to the fourth second aspect, the second oxide layer is made of tin oxide.

The first oxide layer is made of at least one of aluminum oxide, gallium oxide, tantalum oxide, or a complex oxide containing two or more kinds of cations of the aluminum oxide and the gallium oxide.

Forty Seventh Aspect

In the light-emitting element according to the forty second aspect, the second oxide layer is made of strontium titanate.

The first oxide layer is made of at least one of aluminum oxide, gallium oxide, tantalum oxide, zirconium oxide, hafnium oxide, or a complex oxide containing two or more kinds of cations of the aluminum oxide, the gallium oxide, the tantalum oxide, the zirconium oxide, and the hafnium oxide.

Forty Eighth Aspect

In the light-emitting element according to any one of the thirty third to forty seventh aspects, an energy difference between a lower end of a conduction band and an upper end of a valence band in the first oxide layer is larger than an energy difference between a lower end of a conduction band and an upper end of a valence band in the second oxide layer.

Forty Ninth Aspect

In the light-emitting element according to any one of the thirty third to forty eighth aspects, a density of electrons in the second oxide layer is higher than a density of electrons in the first oxide layer.

Fiftieth Aspect

In the light-emitting aspect according to the thirty third to forty ninth aspects, an electron affinity of the second oxide layer is greater than an electron affinity of the light-emitting layer.

An electron affinity of the first oxide layer is smaller than an electron affinity of the light-emitting layer.

Fifty First Aspect

In the light-emitting element according to any one of the thirty third to fiftieth aspects, the first oxide layer has a film thickness of 0.2 nm or more and 5 nm or less.

Fifty Second Aspect

In the light-emitting element according to fifty first aspect, the first oxide layer has a film thickness of 0.8 nm or more and 3 nm or less.

Fifty Third Aspect

In the light-emitting element according to any one of the thirty third to fifty second aspects, the density of the oxygen atoms in the second oxide layer is higher than or equal to 50%, and lower than or equal to 95%, of the density of the oxygen atoms in the first oxide layer.

Fifty Fourth Aspect

In the light-emitting element according to the fifty third aspect, the density of the oxygen atoms in the second oxide layer is higher than or equal to 50%, and lower than or equal to 84%, of the density of the oxygen atoms in the first oxide layer.

Fifty Fifth Aspect

In the light-emitting element according to any one of the thirty third to fifty fourth aspects, the density of the oxygen atoms in the second oxide layer is higher than or equal to 50% of the density of the oxygen atoms in the first oxide layer.

Fifty Sixth Aspect

The light-emitting element according to any one of the nineteenth to thirty second aspects further includes: a third oxide layer provided between the light-emitting layer and the second electrode and; and
 a fourth oxide layer provided between the third oxide layer and the second electrode, and having contact with the third oxide layer.

The fourth oxide layer is made of an n-type semiconductor.

A density of oxygen atoms in the fourth oxide layer is lower than a density of oxygen atoms in the third oxide layer.

Fifty Seventh Aspect

In the light-emitting element according to the fifty sixth aspect, the density of the oxygen atoms in the fourth oxide layer is lower than the density of the oxygen atoms in the third oxide layer.

Fifty Eighth Aspect

In the light-emitting element according to any one of the first to fifty seventh aspect, the light-emitting layer contains a quantum-dot phosphor.

Fifty Ninth Aspect

A light-emitting device includes the light-emitting element according to any one of the first to fifty eighth aspects.

Sixtieth Aspect

A display device includes the light-emitting element according to any one of the first to fifty eighth aspects provided on a substrate.

Sixty First Aspect

A lighting device includes the light-emitting element according to any one of the first to fifty eighth aspects provided on a substrate.

ADDITIONAL REMARKS

The present disclosure shall not be limited to the embodiments described above, and can be modified in various manners within the scope of claims. The technical aspects disclosed in different embodiments are to be appropriately combined together to implement another embodiment. Such an embodiment shall be included within the technical scope of the present disclosure. Moreover, the technical aspects disclosed in the embodiments may be combined to achieve a new technical feature.

INDUSTRIAL APPLICABILITY

The present disclosure is applicable to a light-emitting element and a light-emitting device.

The invention claimed is:

1. A light-emitting element, comprising:
a first electrode serving as an anode;
a second electrode serving as a cathode;
a light-emitting layer provided between the first electrode and the second electrode;
a first oxide layer provided between the light-emitting layer and the first electrode; and
a second oxide layer provided between the first oxide layer and the light-emitting layer, and having contact with the first oxide layer, wherein
a density of oxygen atoms in the second oxide layer is lower than a density of oxygen atoms in the first oxide layer,
the first oxide layer is made of a semiconductor,
the first electrode, the second electrode, the light-emitting layer, the first oxide layer, and the second oxide layer are provided above a face of a substrate, and
either the first oxide layer or the second oxide layer whichever is positioned below the other one, is shaped as a plurality of islands.

2. The light-emitting element according to claim 1, wherein
a portion of at least an upper face of either the first oxide layer or the second oxide layer, whichever is positioned below the other one, is polycrystalline.

3. The light-emitting element according to claim 1, wherein
between the first oxide layer and the second oxide layer, whichever is positioned above the other one, is made of an amorphous oxide.

4. The light-emitting element according to claim 1, wherein
the second oxide layer is made of an oxide comprising any one or more of elements Sr, La, Y, Si, and Ge, as main components.

5. The light-emitting element according to claim 1, wherein
the second oxide layer has a film thickness of 0.2 nm or more and 5 nm or less.

6. The light-emitting element according to claim 1, wherein
the density of the oxygen atoms in the second oxide layer is higher than or equal to 50%, and lower than or equal to 90%, of the density of the oxygen atoms in the first oxide layer.

7. A light-emitting device, comprising the light-emitting element according to claim 1.

8. A light-emitting element comprising:
a first electrode serving as an anode;
a second electrode serving as a cathode;
a light-emitting layer provided between the first electrode and the second electrode;
a first oxide layer provided between the light-emitting layer and the first electrode; and
a second oxide layer provided between the first oxide layer and the light-emitting layer, and having contact with the first oxide layer, wherein
a density of oxygen atoms in the second oxide layer is lower than a density of oxygen atoms in the first oxide layer,
the first oxide layer is made of a semiconductor, and
the first oxide layer comprises at least one of nickel oxide or copper-aluminum oxide.

9. The light-emitting element according to claim 8, wherein
the second oxide layer comprises at least one of strontium oxide, lanthanum oxide, yttrium oxide, silicon oxide, germanium oxide, or a complex oxide comprising two or more kinds of cations of the strontium oxide, the lanthanum oxide, the yttrium oxide, the silicon oxide, and the germanium oxide.

10. A light-emitting element, comprising:
a first electrode serving as an anode;
a second electrode serving as a cathode;
a light-emitting layer provided between the first electrode and the second electrode;
a first oxide layer provided between the light-emitting layer and the second electrode; and
a second oxide layer provided between the first oxide layer and the second electrode, and having contact with the first oxide layer, wherein
a density of oxygen atoms in the second oxide layer is lower than a density of oxygen atoms in the first oxide layer, and
the second oxide layer is made of an n-type semiconductor.

11. The light-emitting element according to claim 10, wherein
the second oxide layer is made of an oxide comprising any one of elements In, Sn, or Ti with a highest content other than oxygen.

12. The light-emitting element according to claim 10, wherein
the first oxide layer is made of an oxide comprising any one of elements Al, Ga, Ta, Zr, Hf, Ge, or Si with a highest content other than oxygen.

13. The light-emitting element according to claim 10, wherein
the second oxide layer is made of zinc oxide, and
the first oxide layer is made of at least one of aluminum oxide, gallium oxide, tantalum oxide, zirconium oxide, hafnium oxide, germanium oxide, silicon oxide, or a complex oxide comprising two or more kinds of cations of the aluminum oxide, the gallium oxide, the tantalum oxide, the zirconium oxide, the hafnium oxide, the magnesium oxide, the germanium oxide, and the silicon oxide.

14. The light-emitting element according to claim 10, wherein
the second oxide layer is made of titanium oxide, and
the first oxide layer is made of at least one of aluminum oxide, gallium oxide, or a complex oxide comprising two or more kinds of cations of the aluminum oxide and the gallium oxide.

15. The light-emitting element according to claim 10, wherein
the second oxide layer is made of indium oxide, and
the first oxide layer is made of at least one of aluminum oxide, gallium oxide, tantalum oxide, zirconium oxide, hafnium oxide, magnesium oxide, germanium oxide, or a complex oxide comprising two or more kinds of cations of the aluminum oxide, the gallium oxide, the tantalum oxide, the zirconium oxide, the hafnium oxide, the magnesium oxide, and the germanium oxide.

16. The light-emitting element according to claim 10, wherein
    the second oxide layer is made of tin oxide, and
    the first oxide layer is made of at least one of aluminum oxide, gallium oxide, tantalum oxide, or a complex oxide comprising two or more kinds of cations of the aluminum oxide, the gallium oxide, and the tantalum oxide.

17. The light-emitting element according to claim 10, wherein
    the second oxide layer is made of strontium titanate, and
    the first oxide layer is made of at least one of aluminum oxide, gallium oxide, tantalum oxide, zirconium oxide, hafnium oxide, or a complex oxide comprising two or more kinds of cations of the aluminum oxide, the gallium oxide, the tantalum oxide, the zirconium oxide, and the hafnium oxide.

18. The light-emitting element according to claim 10, wherein
    the density of the oxygen atoms in the second oxide layer is higher than or equal to 50%, and lower than or equal to 75%, of the density of the oxygen atoms in the first oxide layer.

19. The light-emitting element according to claim 10, wherein
    the first electrode, the second electrode, the light-emitting layer, the first oxide layer, and the second oxide layer are provided above a face of a substrate, and
    a portion of at least an upper face of either the first oxide layer or the second oxide layer, whichever is positioned below the other one, is polycrystalline.

* * * * *